United States Patent
Ono et al.

(10) Patent No.: US 8,922,025 B2
(45) Date of Patent: Dec. 30, 2014

(54) SEMICONDUCTOR DEVICE

(71) Applicant: Elpida Memory, Inc., Chuo-ku, Tokyo (JP)

(72) Inventors: Kazuo Ono, Tokyo (JP); Riichiro Takemura, Tokyo (JP); Takamasa Suzuki, Tokyo (JP); Kazuhiko Kajigaya, Tokyo (JP); Akira Kotabe, Tokyo (JP); Yoshimitsu Yanagawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/913,985

(22) Filed: Jun. 10, 2013

(65) Prior Publication Data

US 2013/0328187 A1 Dec. 12, 2013

(30) Foreign Application Priority Data

Jun. 12, 2012 (JP) ................. 2012-133091

(51) Int. Cl.
*H01L 23/64* (2006.01)
*H01L 23/66* (2006.01)
*H01L 23/48* (2006.01)
*H01L 23/528* (2006.01)
*H01L 23/498* (2006.01)

(52) U.S. Cl.
CPC ..... *H01L 23/481* (2013.01); *H01L 2224/16146* (2013.01); *H01L 2224/13025* (2013.01); *H01L 2224/13023* (2013.01); *H01L 23/5286* (2013.01); *H01L 23/49811* (2013.01); *H01L 2924/0002* (2013.01)
USPC .................. 257/777; 257/786; 257/E29.143; 257/E23.011

(58) Field of Classification Search
None
See application file for complete search history.

(56) References Cited

U.S. PATENT DOCUMENTS

| | | | | |
|---|---|---|---|---|
| 6,084,779 A | * | 7/2000 | Fang | 361/763 |
| 6,828,666 B1 | * | 12/2004 | Herrell et al. | 257/691 |
| 7,851,246 B2 | * | 12/2010 | Camacho et al. | 438/51 |
| 2005/0017357 A1 | * | 1/2005 | Iida et al. | 257/738 |
| 2005/0224912 A1 | * | 10/2005 | Rogers et al. | 257/532 |

FOREIGN PATENT DOCUMENTS

JP       2005-210106 A       8/2005

OTHER PUBLICATIONS

Chang Liu; Sung-Kyu Lim, "A study of signal integrity issues in through-silicon-via-based 3D ICs," 2010 International Interconnect Technology Conference (IITC), pp. 1,3, Jun. 6-9, 2010.*

(Continued)

*Primary Examiner* — Thomas L Dickey
*Assistant Examiner* — Joseph Schoenholtz
(74) *Attorney, Agent, or Firm* — Sughrue Mion, PLLC

(57) ABSTRACT

There is provided a semiconductor device which includes a plurality of first through-substrate vias that are used to supply power from a first power supply and that penetrate through a substrate structure, and a plurality of second through-substrate vias that are used to supply power from a second power supply different from the first power supply and that penetrate through a substrate structure. The semiconductor device also includes a through-substrate via string composed by the first and second through-substrate vias, in which the first through-substrate vias are located adjacent to one another and the second through-substrate vias are also located adjacent to one another. The through-substrate via string is disposed in the substrate structure for extending in a first direction.

14 Claims, 47 Drawing Sheets

(56) References Cited

OTHER PUBLICATIONS

Kim, Joungho, "IEEE EMC Society Distinguished Lecturer Seminar: Signal Integrity of TSV-Based 3D IC", Terahertz Interconnection and Packag Laboratory, Jul. 21, 2010.*

Definition of oblique downloaded from URL<www.merriam-webster.com/dictionary/oblique> on Apr. 14, 2014.*
Definition of string downloaded from URL http://www.merriam-webster.com/dictionary/string on Apr. 15, 2014.*

* cited by examiner

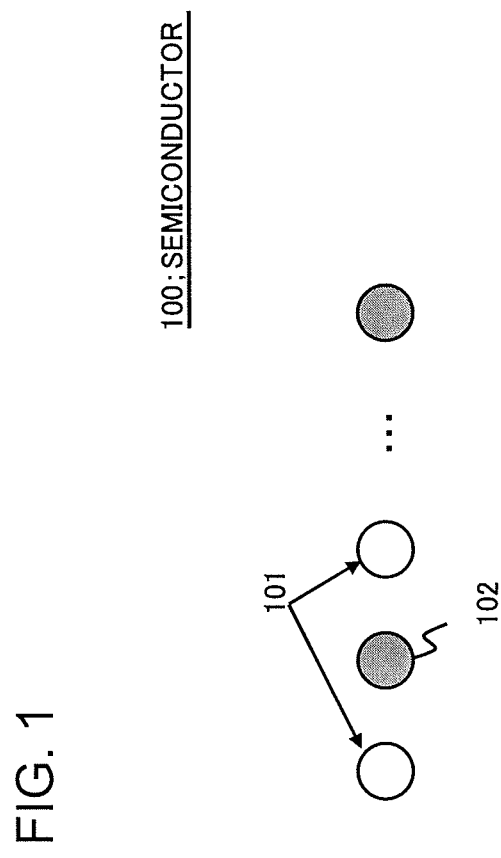

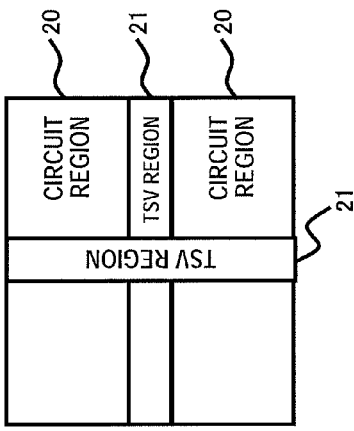
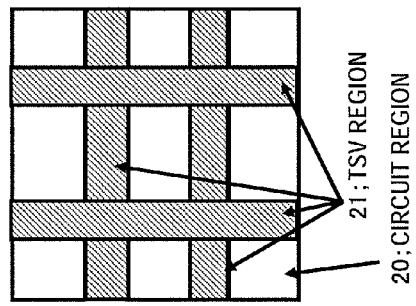
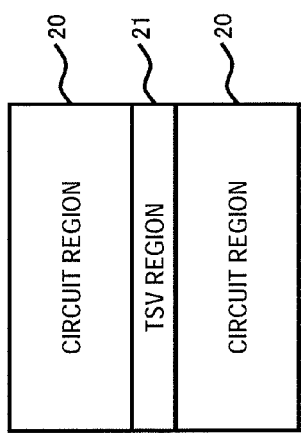
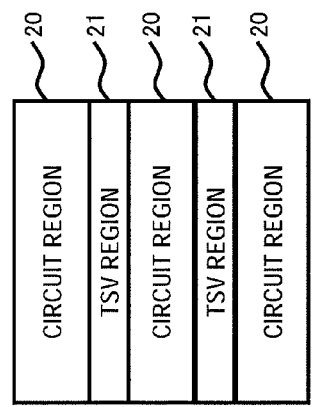

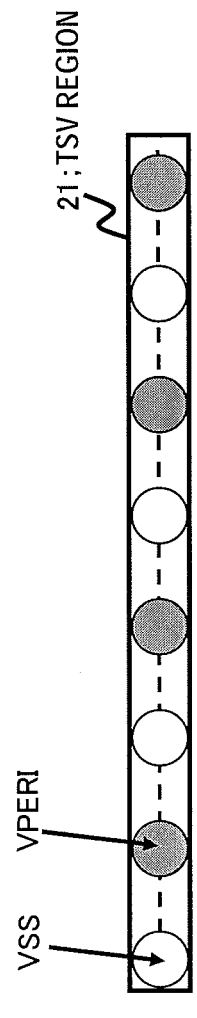
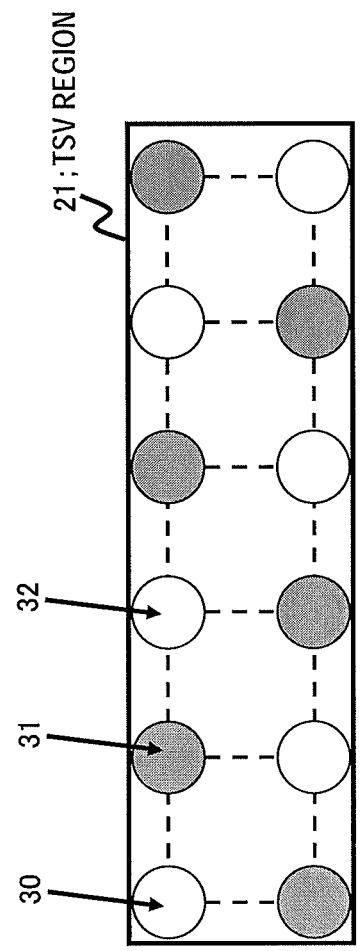
FIG. 5A
FIG. 5B

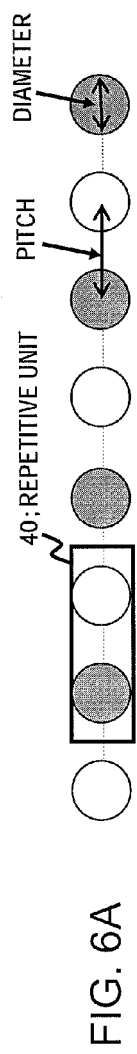
FIG. 6A
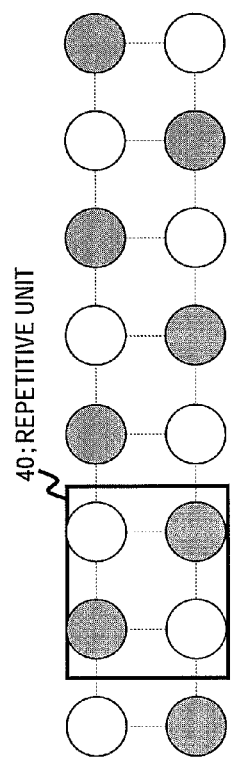
FIG. 6B
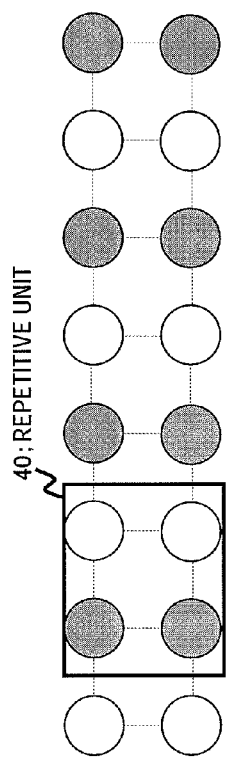
FIG. 6C
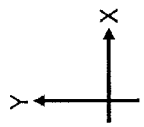

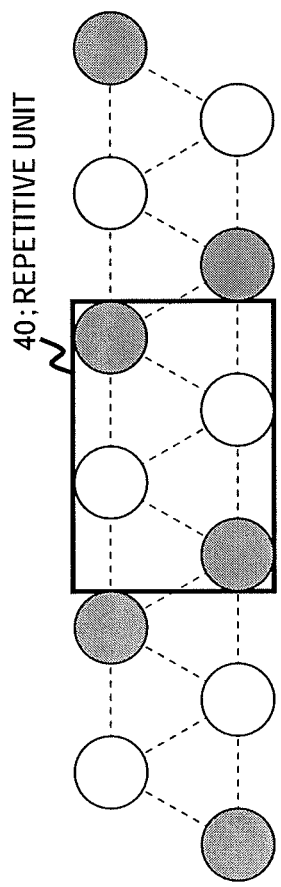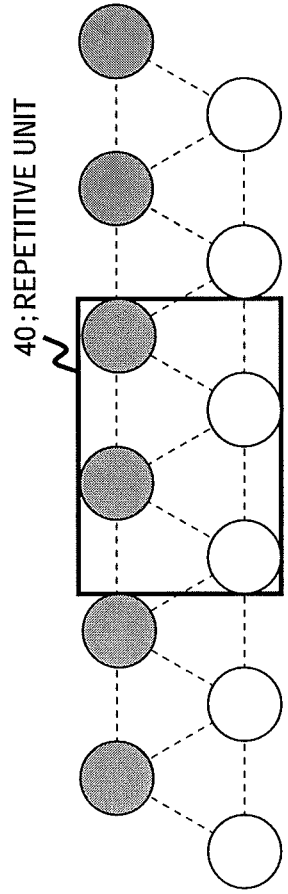
FIG. 7A
FIG. 7B

FIG. 8

| PATTERN NAMES | AREA (μm²) | COUNT OF TSVS | DENSITY | NUMBER OF TIMES OF REPETITIONS | CURRENT VALUE PER TSV (mA) | TOTAL CURRENT (mA) |
|---|---|---|---|---|---|---|
| PATTERN 1 | 2500 | 1 | 1 | 27 | 1 | 27 |
| PATTERN 2 | 7500 | 2 | 0.67 | 9 | 1.5 | 27 |
| PATTERN 3 | 7500 | 2 | 0.67 | 9 | 1.5 | 27 |
| PATTERN 4 | 6830 | 2 | 0.73 | 10 | 1.37 | 27.3 |
| PATTERN 5 | 6830 | 2 | 0.73 | 10 | 1.37 | 27.3 |

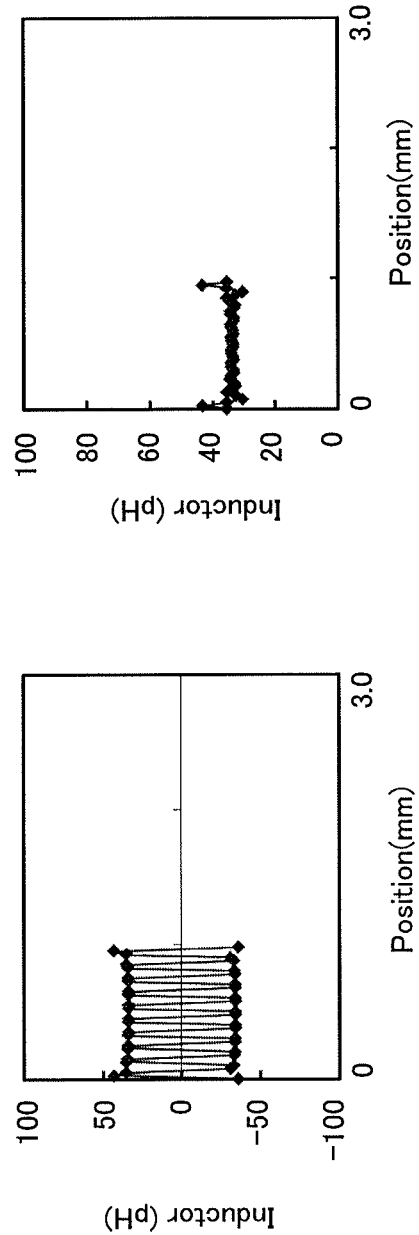

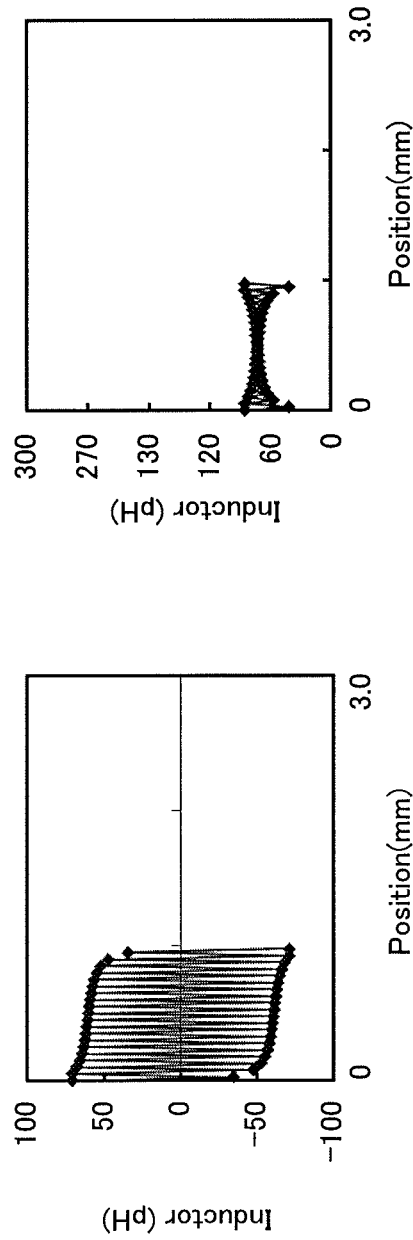
FIG. 13A / FIG. 13B

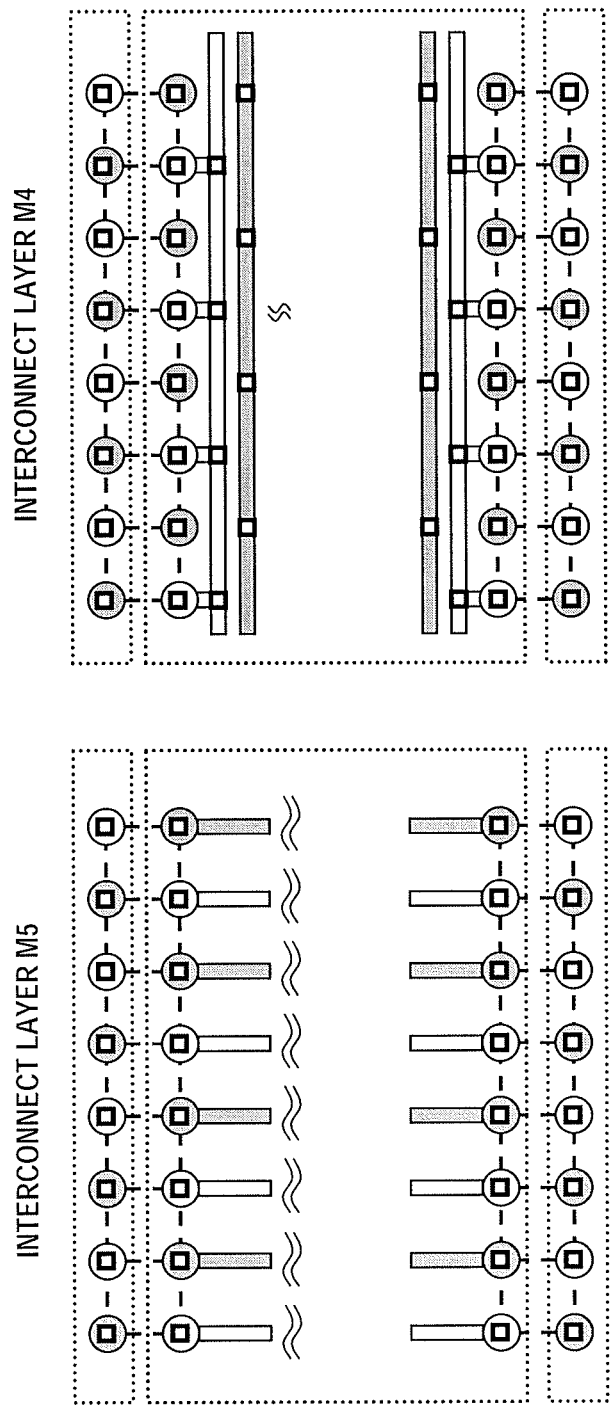

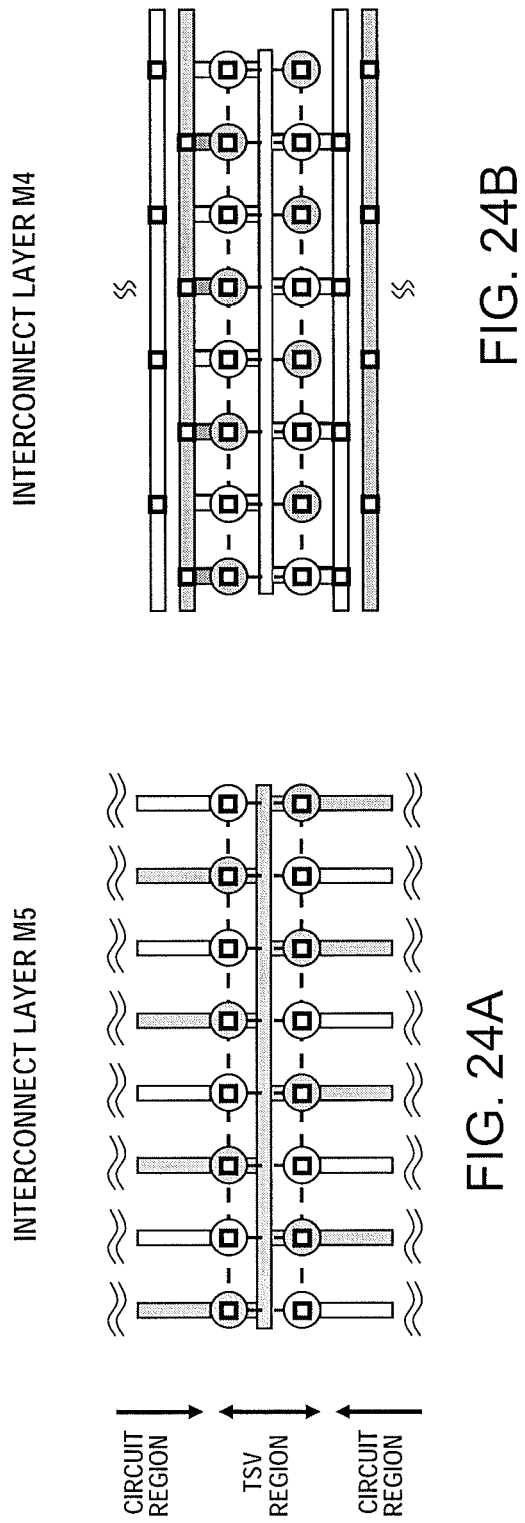

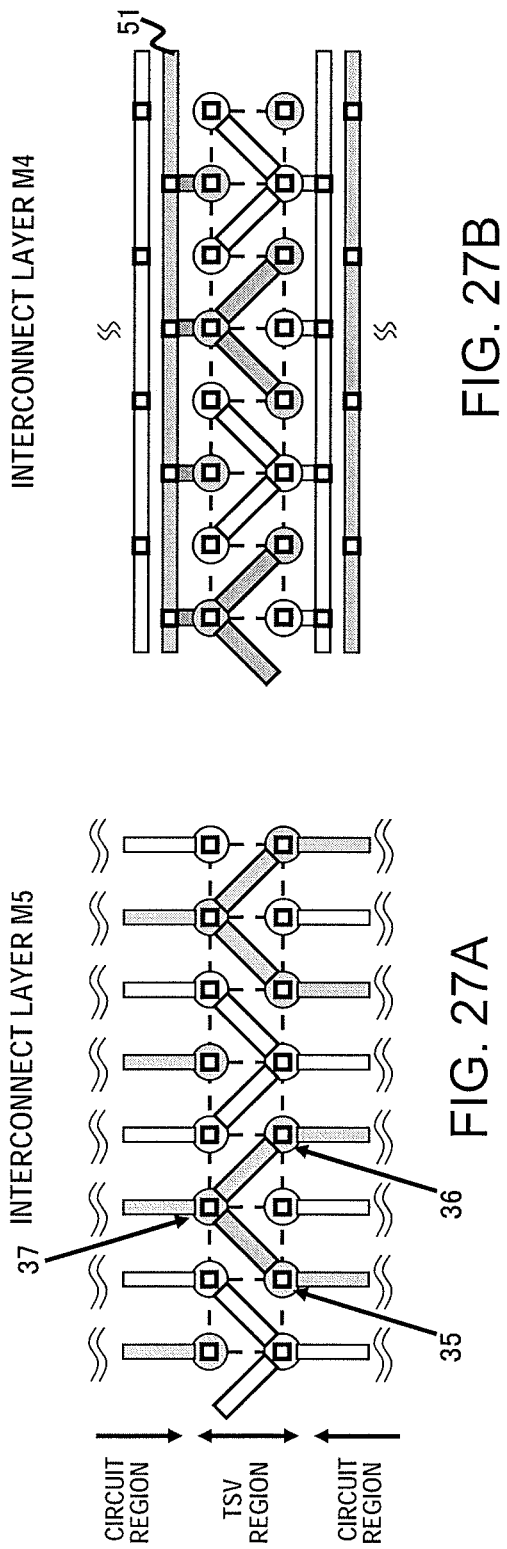

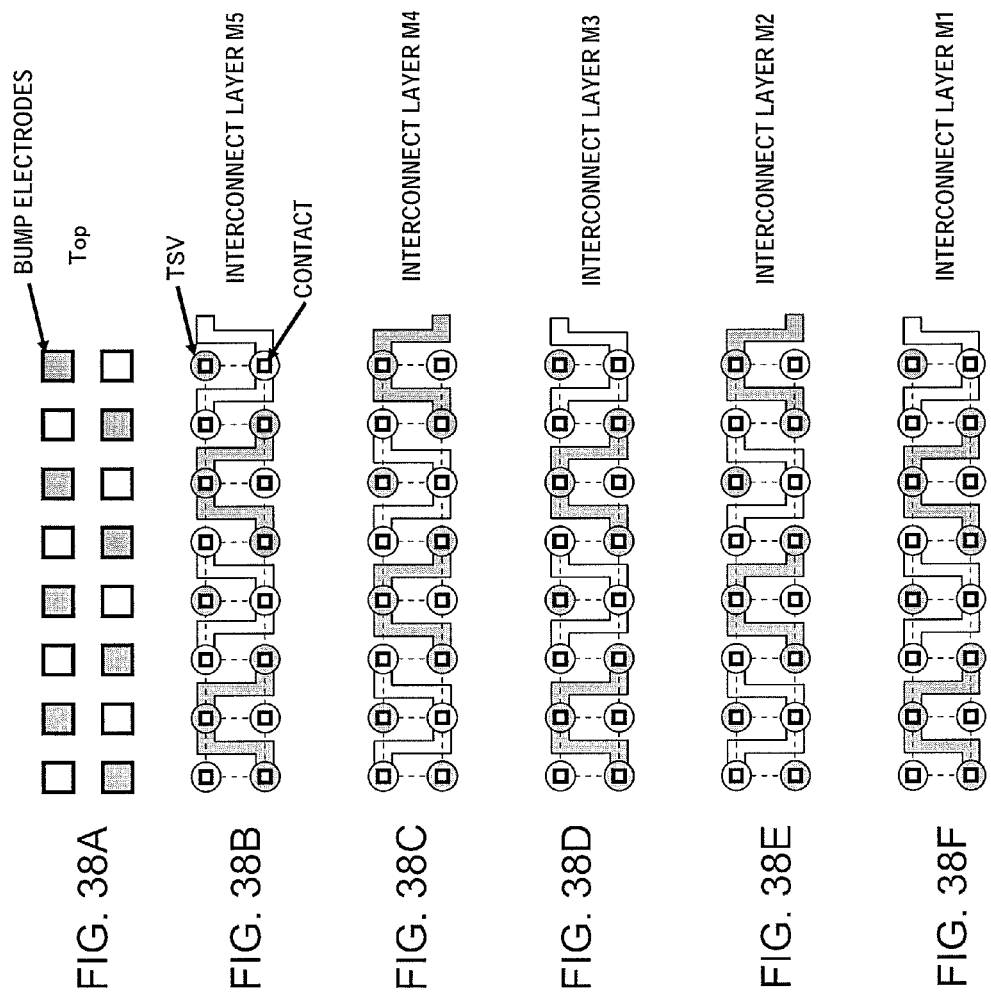

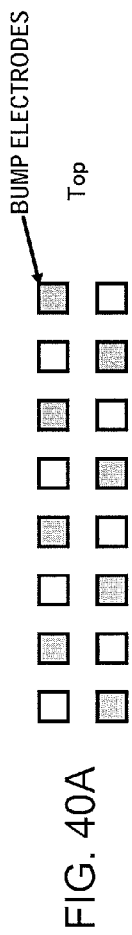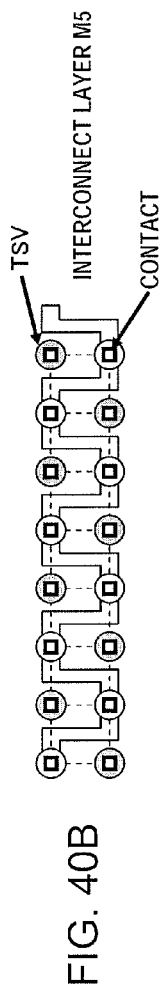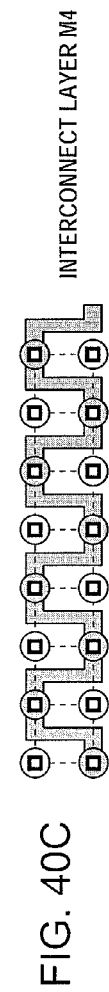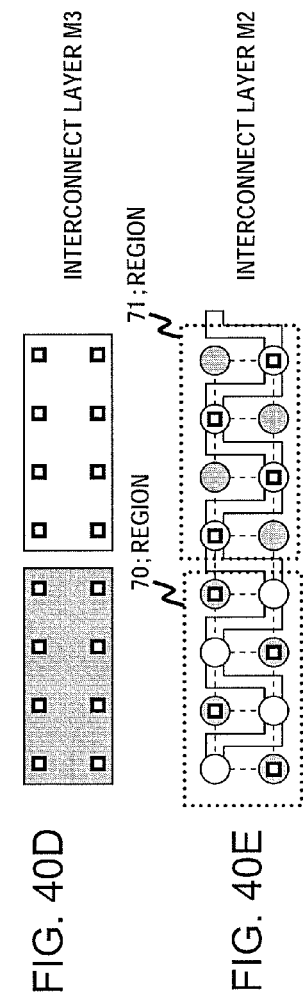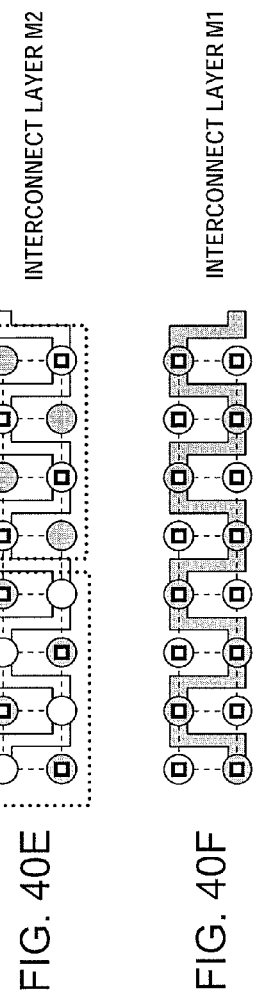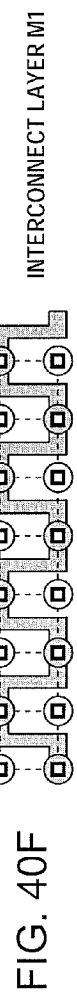

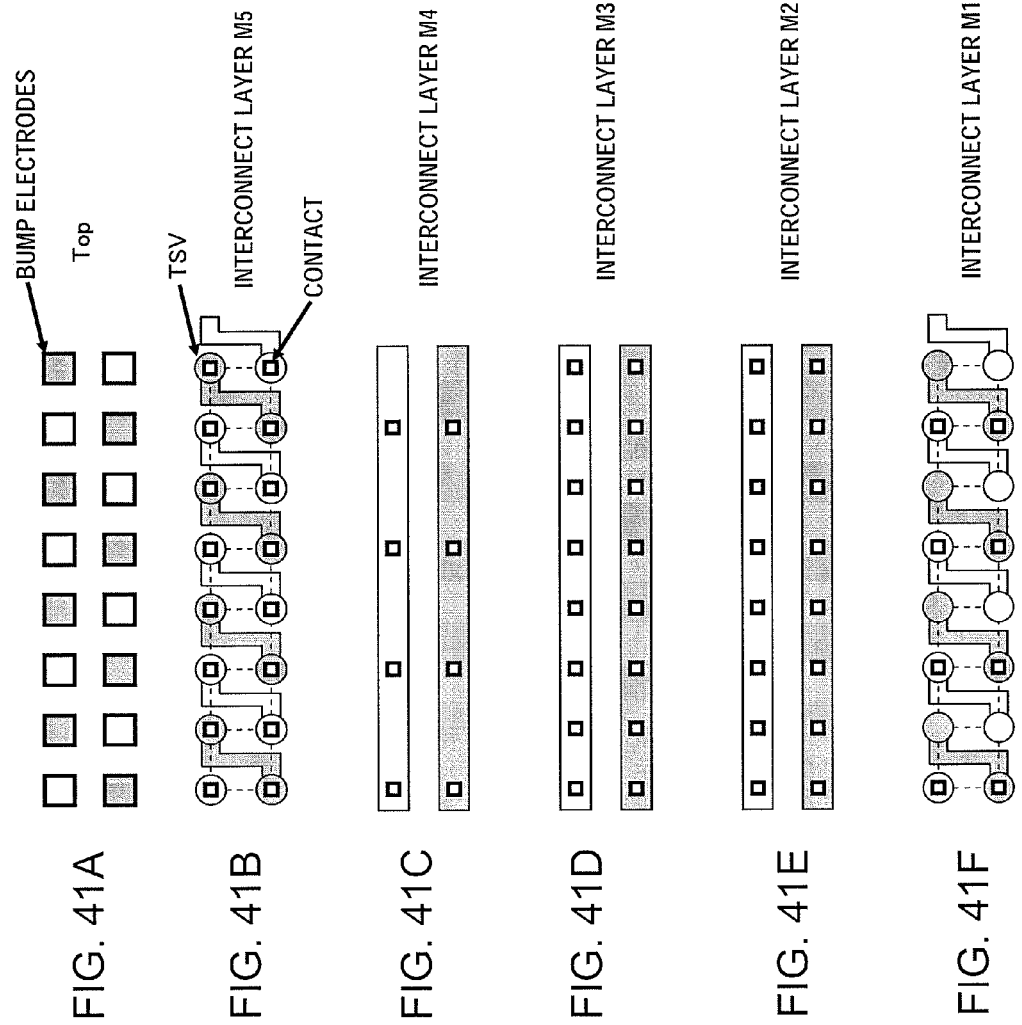

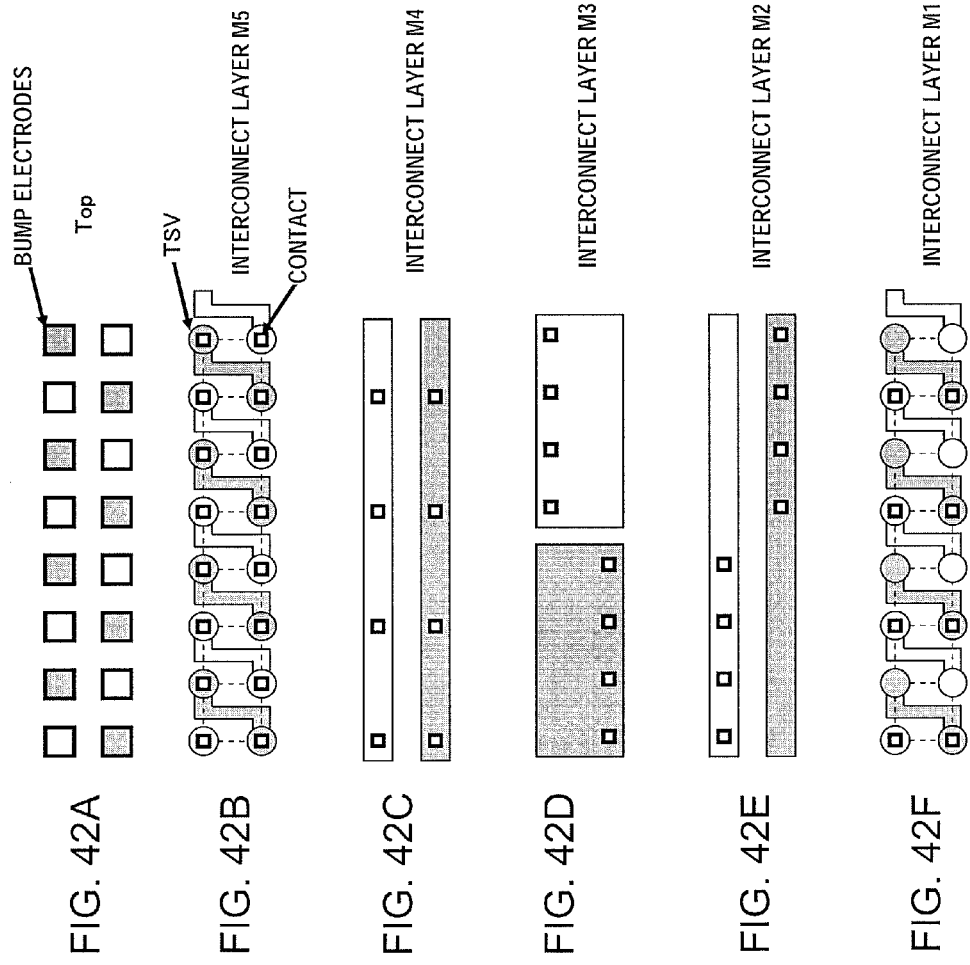

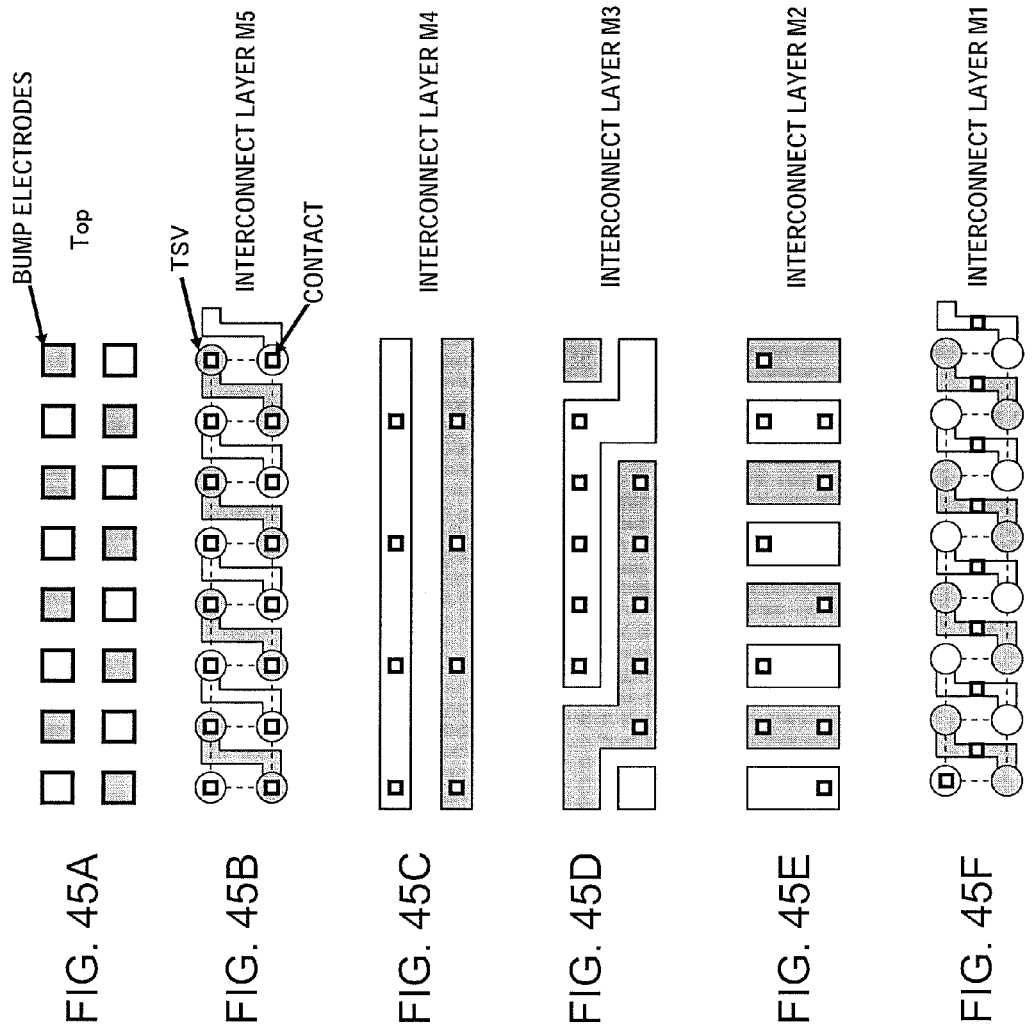

SEMICONDUCTOR DEVICE

BACKGROUND OF THE INVENTION

1. Field of the Invention

This application is based upon and claims the benefit of the priority of Japanese patent application No. 2012-133091, filed on Jun. 12, 2012, the disclosure of which is incorporated herein in its entirety by reference thereto.

This invention relates to a semiconductor device and, more particularly, to a semiconductor device including a through-substrate via.

2. Description of Related Art

Recently, the tendency towards a small size and higher functionality is becoming more apparent in the field of electronic equipment, such as mobile phones or smartphones. For this reason, in a semiconductor device used for such electronic equipment, attempts are ongoing to develop the technology in which a plurality of semiconductor chips are stacked together and the resulting stack product is loaded in a single package.

FIG. 46 shows a cross-sectional view of an example semiconductor device having a plurality of semiconductor chips 12 to 15 stacked together. More specifically, FIG. 46 shows that a plurality of semiconductor chips are stacked on an interfacing chip 11. In such semiconductor chip, the power from a power supply is delivered, in a majority of cases, to each semiconductor chip using a plurality of through-substrate vias (TSVs) 10 penetrating through substrates of the semiconductor chips.

In JP Patent Kokai Publication No. JP2005-210106A (Patent Literature 1), there is shown a semiconductor device in which a through-silicon via constituting an outside-chip signal line is placed adjacent to a through-silicon via constituting a power supply line and a through-silicon via constituting a ground line to reduce the power supply noise.

SUMMARY

The disclosure of the above technical document of the related technique is to be incorporated herein by reference. The following analysis is by the present inventors.

In a semiconductor device including plurality of stacked semiconductor chips, TSVs are frequently used. On the other hand, the load placed on a power supply mesh contained in each semiconductor chip tends to increase on account of an increased number of bus lines in the semiconductor chips and the necessity to drive the bus lines at a high speed. In supplying the power of the power supply by the through-substrate vias, the influences from an inductor in case of load variations are non-negligible. It is because the distance between the TSVs is limited and also because the currents integrated from a plurality of interconnects flow through the TSVs. If the load is subject to variations precipitously, such variations in the load may be observed as an AC noise. FIG. 47A and FIG. 47B show an example supply voltage and an example input current in case the load on the semiconductor chip is subject to such precipitous variations. It is seen from FIG. 47A that the more acutely the load is varied, the more is the AC noise produced. It is also seen from FIG. 47B that there is a correlation between the input current and the rise time tR.

Such power supply noise can be coped with by enlarging the capacitance value of a smoothing capacitor element connected to a power supply line. However, in a recent semiconductor device in which size reduction has been a requirement, it is difficult to provide a capacitor element of large capacitance, since this would increase the chip size to drive up the cost. If the semiconductor chips to be stacked are those of DRAMs (dynamic random access memories), it may be possible to exploit their internal cell capacitances. However, even in such case, the chip size would still be increased owing to the use of the smoothing capacitor element. Thus, such a semiconductor device which could reduce the noise ascribable to the inductor of the TSV has long been desired.

In a first aspect of the present invention, there is provided a semiconductor device, comprising: a plurality of first through-substrate vias that are used to supply power of a first power supply and that penetrate through a substrate structure of the semiconductor device, and another plurality of second through-substrate vias that are used to supply power of a second power supply different from the first power supply and that also penetrate through the substrate structure. The first and second through-substrate vias are arrayed adjacent to one another, extending in a first direction to form a through-substrate via string(s).

BRIEF DESCRIPTION OF THE DRAWINGS

FIG. 1 is a schematic view for illustrating schematics of an exemplary embodiment.

FIG. 3A, FIG. 3B, FIG. 3C and FIG. 3D are plan views showing other example layouts of semiconductor chips contained in the semiconductor device according to the exemplary embodiment 1.

FIG. 5A and FIG. 5B are schematic plan views showing example layouts of dispositions of through-substrate vias in the TSV regions 21.

FIG. 6A, FIG. 6B and FIG. 6C are schematic plan views showing other example layouts of dispositions of through-substrate vias in the TSV regions 21.

FIG. 7A and FIG. 7B are schematic plan views showing further example layouts of dispositions of through-substrate vias in the TSV regions 21.

FIG. 8 shows, in a tabulated form, the overall information regarding repetitive units 40 of respective patterns.

FIG. 12A and FIG. 12B are graphs showing the results of calculations of the inductances of TSVs for a pattern 4.

FIG. 13A and FIG. 13B are graphs showing the results of calculations of the inductances of TSVs for a pattern 5.

FIG. 17A and FIG. 17B are plan views showing another example of power supply interconnects of a semiconductor chip.

FIG. 24A and FIG. 24B are plan views showing a further example of power supply interconnects of a semiconductor chip.

FIG. 27A and FIG. 27B are plan views showing a further example of power supply interconnects of a semiconductor chip.

FIG. 36A, FIG. 36B, FIG. 36C, FIG. 36D, FIG. 35E and FIG. 36F are schematic plan views showing example layouts of contacts from one interconnect layer of the semiconductor chip to another.

FIG. 38A, FIG. 38B, FIG. 38C, FIG. 38D, FIG. 38E and FIG. 38F are schematic plan views showing further example layouts of contacts from one interconnect layer of the semiconductor chip to another.

FIG. 40A, FIG. 40B, FIG. 40C, FIG. 40D, FIG. 40E and FIG. 40F are schematic plan views showing further example layouts of contacts from one interconnect layer of the semiconductor chip to another.

FIG. 41A, FIG. 41B, FIG. 41C, FIG. 41D, FIG. 41E and FIG. 41F are schematic plan views showing further example layouts of contacts from one interconnect layer of the semiconductor chip to another.

FIG. 42A, FIG. 42B, FIG. 42C, FIG. 42D, FIG. 42E and FIG. 42F are schematic plan views showing further example layouts of contacts from one interconnect layer of the semiconductor chip to another.

FIG. 44A, FIG. 44B, FIG. 44C, FIG. 44D, FIG. 44E and FIG. 44F are schematic plan views showing further example layouts of contacts from one interconnect layer of the semiconductor chip to another.

FIG. 45A, FIG. 45B, FIG. 45C, FIG. 45D, FIG. 45E and FIG. 45F are schematic plan views showing further example layouts of contacts from one interconnect layer of the semiconductor chip to another.

PREFERRED MODES

Initially, schematics of an exemplary embodiment will be explained with reference to FIG. 1. It is noted that symbols for reference to the drawings are entered for respective elements to assist in understanding only and are not intended to limit the invention.

A need exists for a semiconductor device capable of reducing the noise ascribable to an inductor of the through-substrate via (TSV), as previously discussed. Thus, a semiconductor device 100 shown in FIG. 1, as an example, is provided. The semiconductor device 100 includes a plurality of first TSVs 101, used to supply power of a first power supply and which penetrate through a substrate structure of the semiconductor device, and another plurality of second TSVs 102, used to supply power of a second power supply different from the first power supply and which also penetrate through the substrate structure. In the semiconductor device 100, the first TSVs 101 are arrayed adjacent to one another, and the second TSVs 102 are also arrayed adjacent to one another. The first and second TSVs are arranged for extending in a first direction to form a TSV string within the above mentioned substrate structure. TSV may be called penetration electrodes, penetration vias, through-electrode, or through-vias The TSVs, used to supply the power of the power supplies of the same sorts, are arrayed so as not to be adjacent to one another, as far as is possible, viz., the TSVs used to supply the power of the power supplies of respective different sorts are arrayed so as to be adjacent to one another. This reduces both inductors of the TSVs and the noise ascribable to the TSV inductors. The reason why the inductors may be reduced by arraying the TSVs used to supply the power of the power supplies of the same sorts, so that these power supplies of the respective same sort are not, to the utmost extent possible, adjacent to one another, will be discussed subsequently.

More specified exemplary embodiments will now be explained in detail with reference to the drawings.

Example 1

An exemplary embodiment 1 will now be detailed with reference to the drawings.

A semiconductor device of the subject exemplary embodiment is constructed by stacking a plurality of semiconductor chips one over others. FIG. 2A, FIG. 2B, FIG. 2C, FIG. 3A, FIG. 3B, FIG. 3C and FIG. 3D show example layouts of semiconductor chips contained in the semiconductor device of the subject exemplary embodiment. Each of the semiconductor chips stacked together includes a circuit region 20 and a TSV region 21. Within the circuit region 20, there are arranged respective modules that implement the functions of the semiconductor chip. Within the TSV region 21, there are arrayed a plurality of through-substrate vias (TSVs).

Figure 2A:
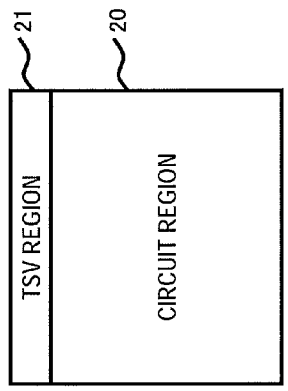
FIG. 2A, FIG. 2B and FIG. 2C are plan views showing example layouts of semiconductor chips contained in the semiconductor device according to the exemplary embodiment 1.
Figure 2B:
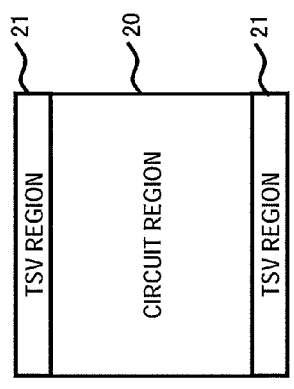
Figure 2C:
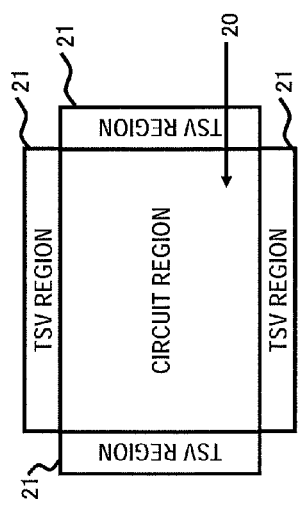

A number of different ways of arraying the circuit regions 20 and the TSV regions 21 may be presupposed to exist. For example, the TSV regions 21 may be arrayed around the rim of the semiconductor chip, as shown in FIG. 2A, FIG. 2B and FIG. 2C. Or, the TSV region(s) 21 may be arrayed within an inner side of the semiconductor chip, as shown in FIG. 3A, FIG. 3B, FIG. 3C and FIG. 3D.

Figure 4:
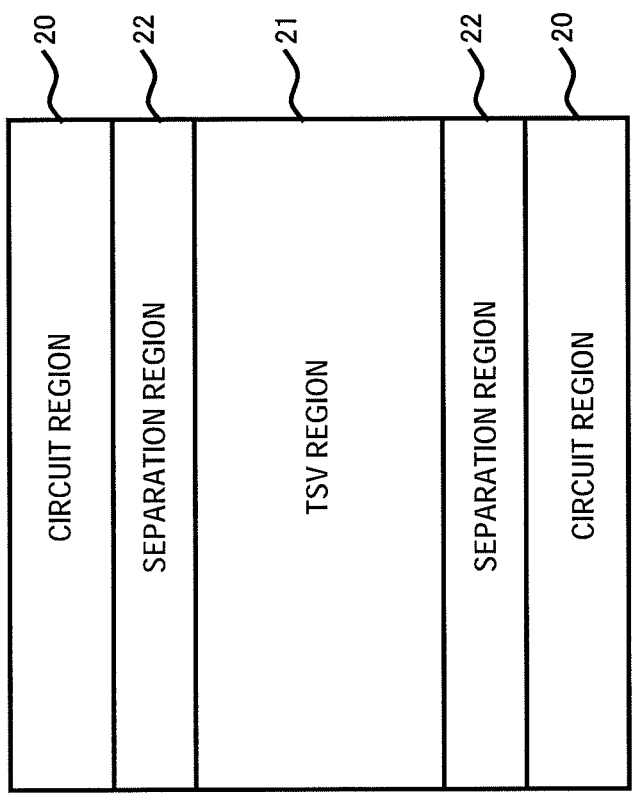
FIG. 4 is a plan view showing an example layout of a semiconductor chip.
Figures 9A, 9B:
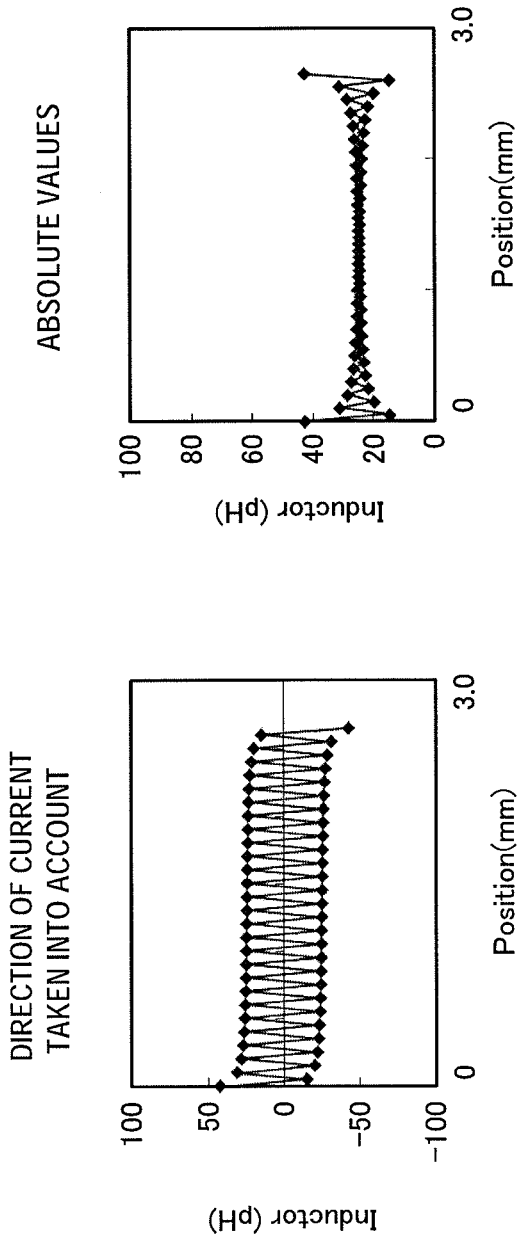
FIG. 9A and FIG. 9B are graphs showing the results of calculations of the inductances of through-substrate vias TSVs for a pattern 1.
Figures 10A, 10B:
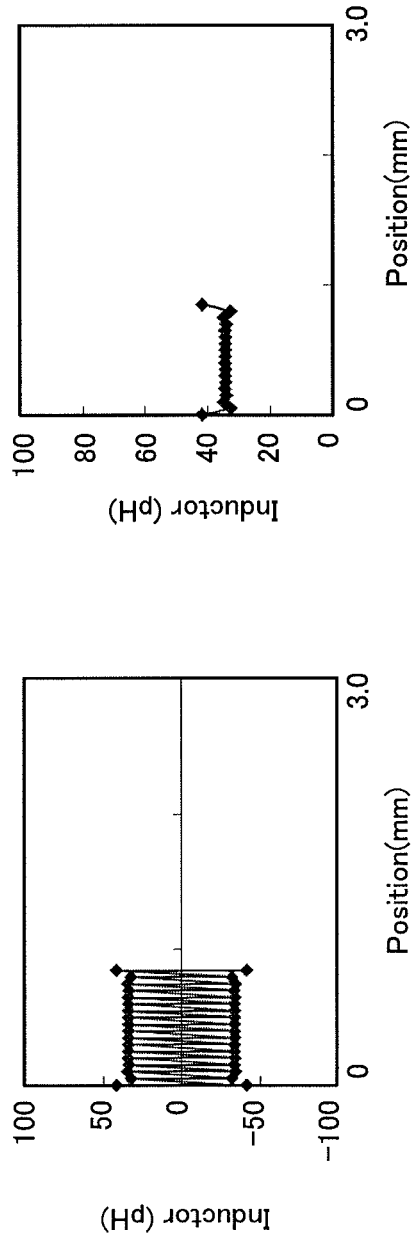
FIG. 10A and FIG. 10B are graphs showing the results of calculations of the inductances of TSVs for a pattern 2.
Figure 11B:
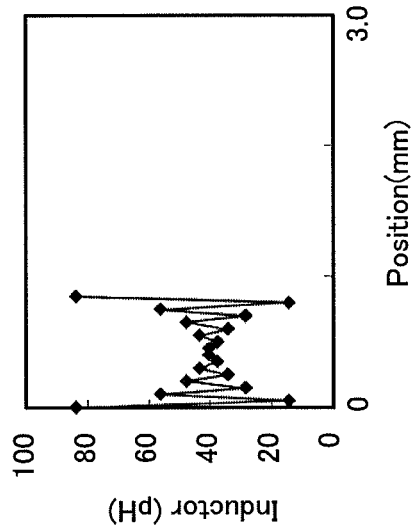
FIG. 11A and FIG. 11B are graphs showing the results of calculations of the inductances of TSVs for a pattern 3.
Figure 11A:
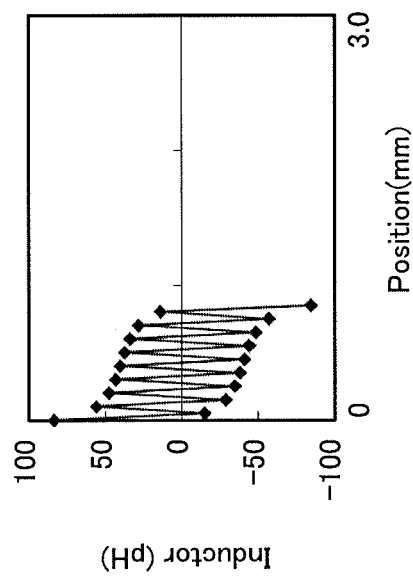

Note that the layouts of FIG. 2A, FIG. 2B, FIG. 2C, FIG. 3A, FIG. 3B, FIG. 3C and FIG. 3D show only schematics of the circuit regions 20 and the TSV regions 21. In actuality, each circuit region and each TSV region are separated from each other by a separation region 22. FIG. 4 shows an example layout of a semiconductor chip. The separation region 22 is provided between the circuit region 20 and the TSV region 21, as shown in FIG. 4. That is, each TSV region 21 is arrayed a defined distance apart from the circuit region 20, while the shape (layout) of the TSV region 21 may freely be changed.

The TSVs, arrayed in the TSV region 21, will now be detailed.

FIG. 5A and FIG. 5B show example dispositions of TSVs in the TSV region 21. Specifically, FIG. 5A and FIG. 5B show TSVs used for supplying the power of the power supply VSS and TSVs used for supplying that of the power supply VPERI. Note that, in the drawings, as referred to in the explanation to follow, shaded circles stand for TSVs configured to supply the power of the power supply VPERI, while non-shaded circles stand for TSVs configured to supply the power of the power supply VSS, unless otherwise specified. In addition, the power of the power supply VSS is equivalent to the ground voltage, while the power of the power supply VPERI is equivalent to the power of the power supply delivered to modules contained in the semiconductor chip.

In the TSV region 21, there exist, in a hybrid state, both the TSVs destined for supplying the power of a power supply of the same sort and the TSVs destined for supplying the power of a power supply of a different sort, as shown in FIG. 5A and FIG. 5B. For example, the TSVs 30 and 32 of FIG. 5B are the TSVs destined for supplying the power of the power supply of the same sort, while the TSVs 30 and 31 are TSVs destined for supplying the power of the power supplies of respective different sorts. The power supply of the same sort denotes the power supply which delivers the power via the TSVs arranged in the TSV region 21, and which represents a common power supply source. On the other hand, the power supply of the different sort denotes the power supply which delivers the power via the TSVs arranged in the TSV region 21 and which represents a power supply source(s) differing from the above mentioned common power supply source.

In the TSV region 21, the TSVs may be arrayed in a single row, as shown in FIG. 5A, or in two rows, as shown in FIG. 5B.

The manner of deciding the arraying of the TSVs in the TSV region 21 will now be detailed.

The TSVs are arrayed so that the value of the current flowing through the TSVs existing in a unit area of the TSV region 21 will be constant. In arraying the TSVs in this manner, it may be envisaged to use a method of changing the number of repetitive units, with the diameter of the TSV remaining constant. The repetitive units will be detailed subsequently.

FIGS. 6A, 6B, 6C, 7A and 7B show example dispositions of the TSVs in the TSV regions 21. If the TSVs are arrayed in one row, a TSV pair made up of a TSV destined for the power supply VSS and another TSV destined for the power supply VPERI may be used as a repetitive unit 40, as shown in FIG. 6A. That is, the TSVs destined for supplying the power of the power supplies of respective different sorts may be arrayed adjacent to each other and disposed in an X-direction in FIGS. 6A, 6B and 6C. If the TSVs are arrayed in two rows, as shown in FIG. 6B and FIG. 6C, two TSV pairs may be used as the repetitive unit 40. FIG. 6B and FIG. 6C differ from each other in that, in FIG. 6B, TSVs destined for supplying the power from the power supplies of respective different sorts are disposed in a column, whereas, in FIG. 6C, TSVs destined for supplying the power of the power supplies of the respective same sorts are disposed in a column.

When the TSVs are arrayed in two rows, the TSVs of the two rows may be staggered, that is, arrayed with a shift of a half cycle, relative to each other, as shown in FIGS. 7A and 7B. It is noted that the TSVs are arrayed so that, as will be apparent from FIGS. 6A, 6B, 6C, 7A and 7B, the pitch of the neighbored TSVs will be constant in the transverse direction (X-direction in FIGS. 6A, 6B and 6C), in the vertical direction (Y-direction in FIGS. 6A, 6B and 6C) or in the oblique direction. Note that, in the explanation to follow, the arrays or dispositions shown in FIGS. 6A, 6B and 6C are denoted as patterns 1 to 3, respectively, whilst those shown in FIG. 7A and FIG. 7B are denoted as patterns 4 and 5, respectively.

The following describes the values of the currents flowing through the repetitive units in the respective patterns.

If the pitch between neighbored TSVs is a1 μm and the diameter of the TSV is b1 μm, the area of the repetitive unit 40 of FIG. 6A is $b1 \times 2 \times a1$ μm². If a1 is 50 μm and b1 is 25 μm, the area of the repetitive unit 40 is 2500 μm². Since a TSV pair is contained in the repetitive unit 40 of the pattern 1, the TSV pair contained in the repetitive unit 40 has a density equal to 1 (unity). Moreover, if the TSV region 21 is formed by repetition by 27 times of the repetitive unit 40, the sum total of the current flowing through the TSV region 21 is 27 times the current flowing through the repetitive unit 40. The value of the current flowing through the repetitive unit 40 is here assumed to be 1 mA.

In similar manner, if a1 is 50 μm and b1 is 25 μm, the area of the repetitive unit 40 of the pattern 2 or 3 is 75×100 μm². Also, two TSV pairs are contained in the repetitive unit 40 and the area of the repetitive unit 40 of the pattern 2 or 3 is three times that of the repetitive unit of the pattern 1, so that the TSV pair in the repetitive unit 40 has a density of 2÷3=0.67. On the other hand, since the area is threefold, the number of times of repetition is ⅓ (=9 times).

The area of the repetitive unit 40 of the pattern 4 or 5 is $25(1+\sqrt{3}) \times 100$ μm², and two TSV pairs are contained in the repetitive unit 40. The area of the repetitive unit 40 of the pattern 4 or 5 is 2.7 times that of the repetitive unit 40 of the pattern 1. Hence, the density of the two TSV pairs in the repetitive unit 40 of the pattern 4 or 5 is 0.73. Since the area is 2.7-fold, the number of times of repetition is 10 (times).

FIG. 8 shows, in a tabulated form, the information regarding the repetitive units 40 of the respective patterns. If, based on the calculated results, the sum total of the currents in the case of the patterns 1 to 3 is calculated, the result is 27 mA. The sum total of the current in the case of the patterns 4 or 5 is 27.3 mA. If viewed in a different way, the results of comparison of the values of currents flowing in the respective TSVs of the patterns 1 to 5, in case the same current, herein ca. 27 mA, is caused to flow in the TSVs regions 21, the area of which is assumed to be constant, are shown in FIG. 8.

The inductance of each TSV in each pattern will now be explained. In the explanation, the following is presupposed: The current flows through the center of a conductor, with the sum total of the current flowing through the power supply VSS and that flowing through the power supply VPERI remaining constant. Although the remote distance interaction of all TSVs contained in the multiple semiconductor chips is taken into consideration, the magnetic shielding effect or the skin effect is not. The TSV is 150 µm in length and is formed of copper (Cu). The magnetic permeability of vacuum is used. The count of the lines of the power supply VSS is equal to that of the power supply VPERI. Using the above mentioned conditions as premises, the self-inductance and the mutual inductance are calculated to find the inductance of each of the TSVs.

Initially, the self-inductance is calculated. The self-inductance is an inductor component induced in the conductor itself by the magnetic field created by the current flowing through the conductor, and is proportionate to the current flowing through the conductor. This self-inductance L may be calculated by the following equation:

$$L = \frac{\mu}{2\pi}\left[l\ln\left(\frac{l+\sqrt{l^2+\rho^2}}{\rho}\right) - \sqrt{l^2+\rho^2} + \rho + \frac{l}{4}\right] \quad (1)$$

where l is a length of the TSV, $\rho$ is the radius of the TSV and µ is the magnetic permeability of vacuum.

Next, the mutual inductance is calculated. The mutual inductance is an inductor component induced by a magnetic field created by the current flowing through another conductor, and is proportionate to the current flowing through the other conductor. The mutual inductance may be calculated by the following equation (2):

$$M = \frac{\mu}{2\pi}\left[l\ln\left(\frac{l+\sqrt{l^2+d^2}}{d}\right) - \sqrt{l^2+d^2} + d\right] \quad (2)$$

where d is the TSV pitch.

FIG. 9A, FIG. 9B, FIG. 10A, FIG. 10B, FIG. 11A, FIG. 11B, FIG. 12A, FIG. 12B, FIG. 13A and FIG. 13B represent the results of calculations of the inductance of each of the TSVs in each of the patterns 1 to 5. In these figures, the abscissa denotes the positions of the TSVs the inductance values of which are to be calculated. The ordinates of FIG. 9A, FIG. 10A, FIG. 11A, FIG. 12A and FIG. 13A denote the inductance values inverted in sign in order to take the directions of the currents flowing through the respective TSVs into account. Since the TSVs that supply the power of the power supplies of the different sorts are disposed in alternation with each other, the signs of the inductance of the TSVs are inverted correspondingly. It is noted that FIG. 9B, FIG. 10B, FIG. 11B, FIG. 12B and FIG. 13B denote absolute inductance values. The graph of FIG. 14 shows the results of FIG. 9B, FIG. 10B, FIG. 11B, FIG. 12B and FIG. 13B taken together.

Figure 14:
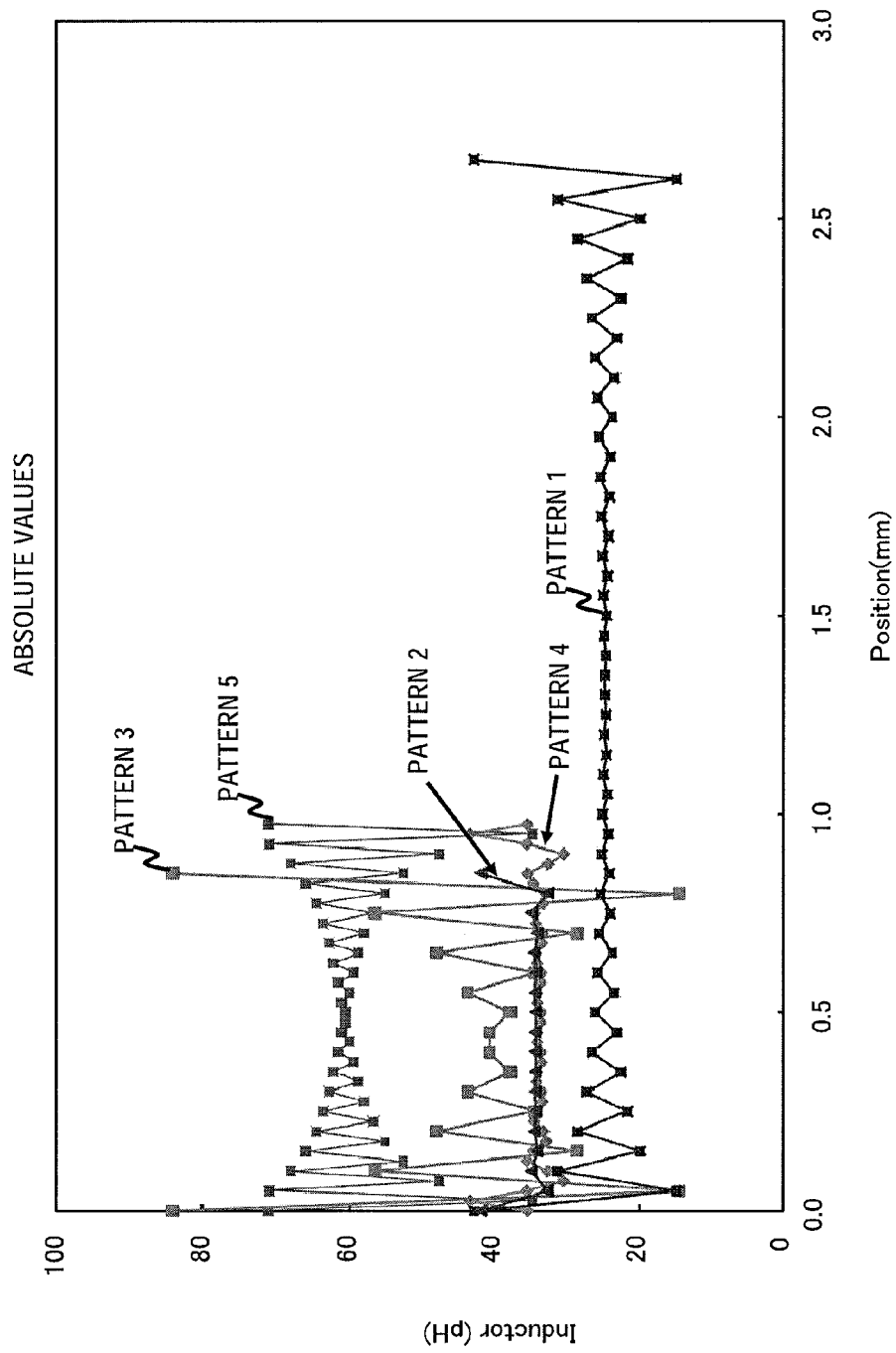
FIG. 14 is a graph showing the transitions in FIG. 9B, FIG. 10B, FIG. 11B, FIG. 12B and FIG. 13B collected together.

From FIG. 14, it is seen that the inductance of each TSV may be lowest with the disposition of the TSVs according to the pattern 1. That is, the pattern 1 with the transversely arrayed TSVs in the TSV region 21 has the utmost inductance reducing effect. It is also seen that, in case the TSVs are arrayed in two rows, the patterns 2 and 4 give rise to the utmost inductance reducing effect.

The relationship between the count of rows of the TSVs arrayed in the TSV region 21 and the inductance reducing effect will now be discussed.

Figure 15:
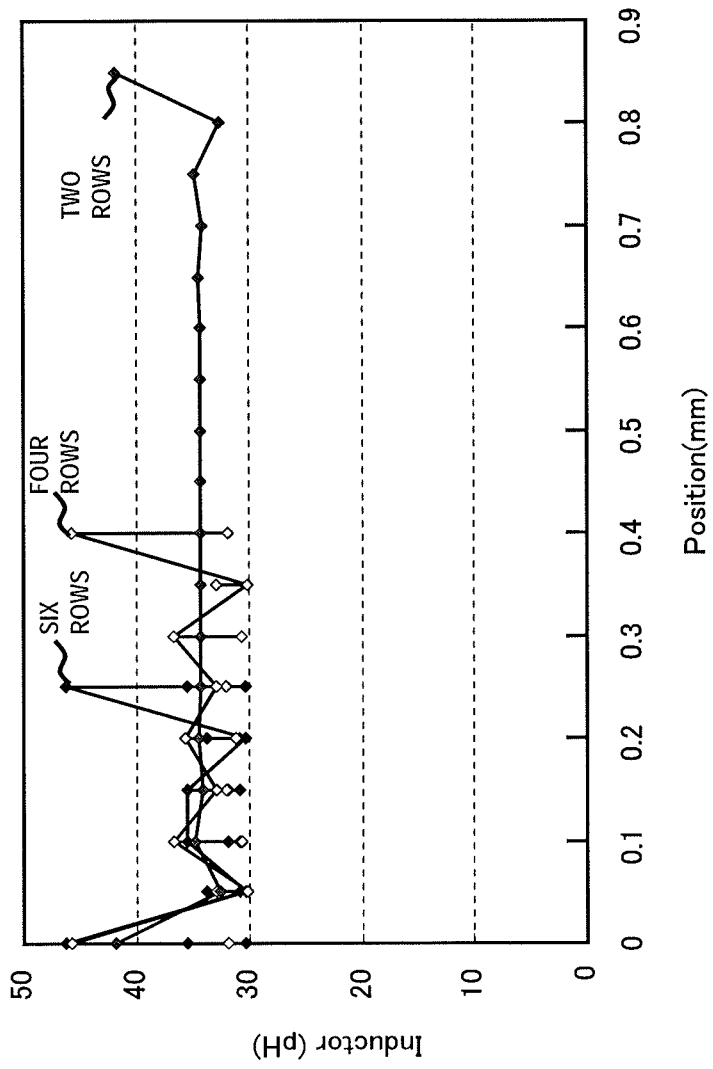
FIG. 15 is a graph showing transitions of typical inductances for different numbers of rows of TSVs arrayed in the TSV regions 21.

FIG. 15 shows example inductance values for several different counts of the rows of the TSVs arrayed in the TSV region 21. In FIG. 15, the dispositions of the pattern 2 are used, with the counts of the rows of the TSVs arrayed in the TSV region 21 being 2, 4 and 6. It is seen from FIG. 15 that, if the count of the rows of the TSVs contained in the TSV region 21 is increased or decreased, such has merely restricted effects on the average inductance values.

It is thus seen from above that the noise ascribable to the inductor of the TSVs may be reduced by arraying the TSVs so that the TSVs used for supplying the power of the power supplies of the respective same sorts are not arrayed adjacent to one another to the utmost extent possible.

A power supply mesh (power supply interconnects) to provide for an equal current value in each TSV will now be explained. In the explanation, the following is presupposed: The semiconductor chip is a five-layered interconnect structure, with an interconnect layer M5 being an uppermost metal layer. Two sorts of TSVs, viz., the TSVs used to supply the power of the power supply VPERI and those used to supply the power of the power supply VSS, are here to be taken into consideration. A power supply trunk line (main line) forms a power supply mesh in an interconnect layer M4 and in the interconnect layer M5. The TSVs are connected to the set of interconnect layers at an interconnect layer M1. The current produced in the circuit region 20 flows uniformly through the power supply interconnects and through the TSVs.

Initially, such case in which interconnects are unable to implement equal current values through the TSVs is scrutinized. FIG. 16A, FIG. 16B, FIG. 17A, FIG. 17B, FIG. 18A, FIG. 18B, FIG. 19A, FIG. 19B, FIG. 20A and FIG. 20B show example power supply interconnects for semiconductor chips. It is noted that, in the drawings as referred to in the following explanation, shaded circles denote TSVs used to supply power of the power supply VPERI and non-shaded circles those used to supply power of the power supply VSS. Shaded interconnects denote interconnects destined for supplying the power of the power supply VPERI, non-shaded interconnects denote those destined for supplying the power of the power supply VSS, and square marks denote contacts.

Figure 16B:
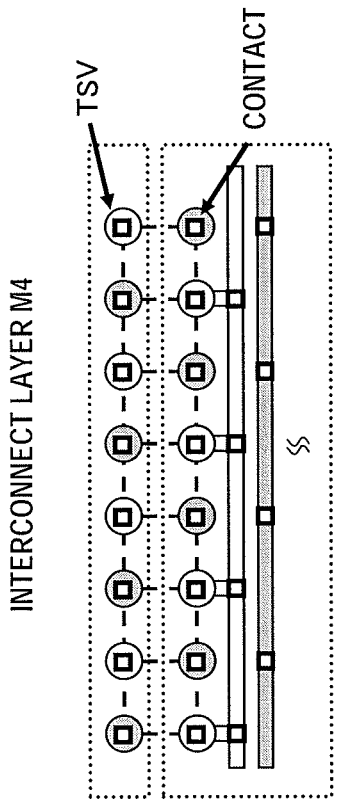
FIG. 16A and FIG. 16B are plan views showing an example of power supply interconnects of a semiconductor chip.
Figure 16A:
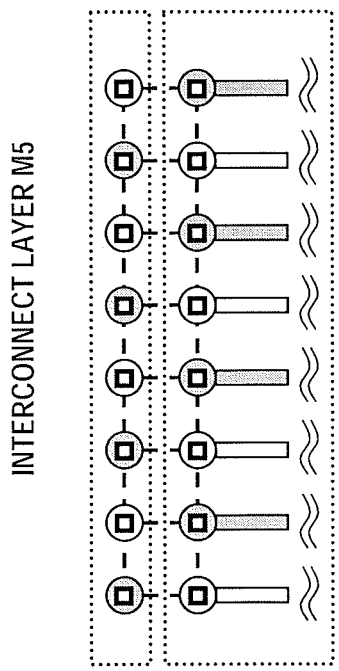
Figure 18A:
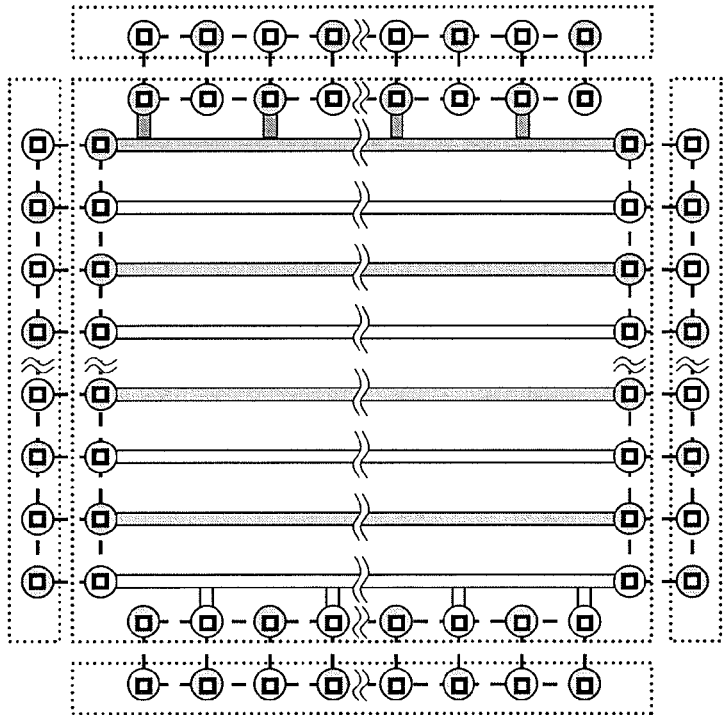
FIG. 18A and FIG. 18B are plan views showing a further example of power supply interconnects of a semiconductor chip.
Figure 18B:
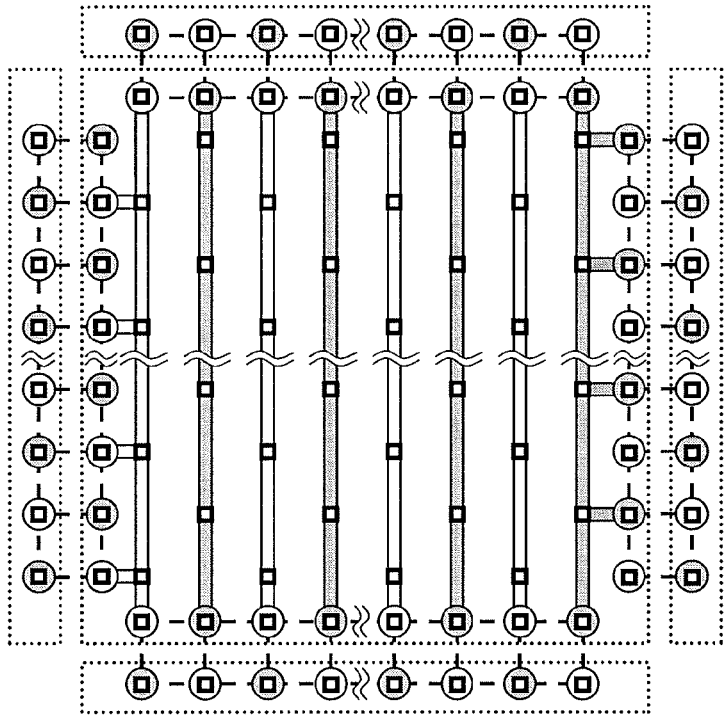
Figure 19B:
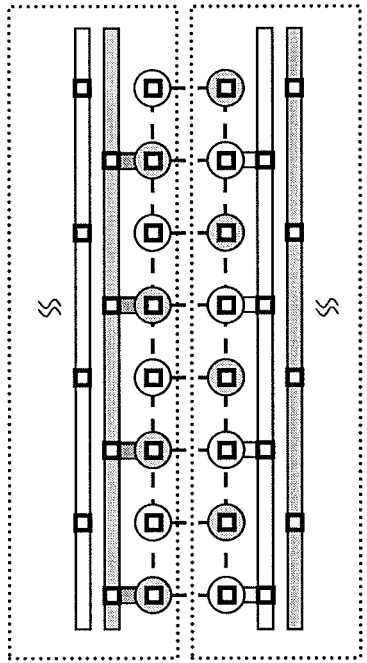
FIG. 19A and FIG. 19B are plan views showing a further example of power supply interconnects of a semiconductor chip.
Figure 19A:
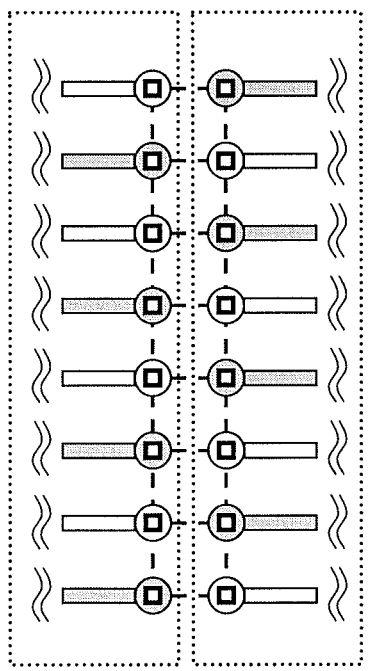
Figure 20B:
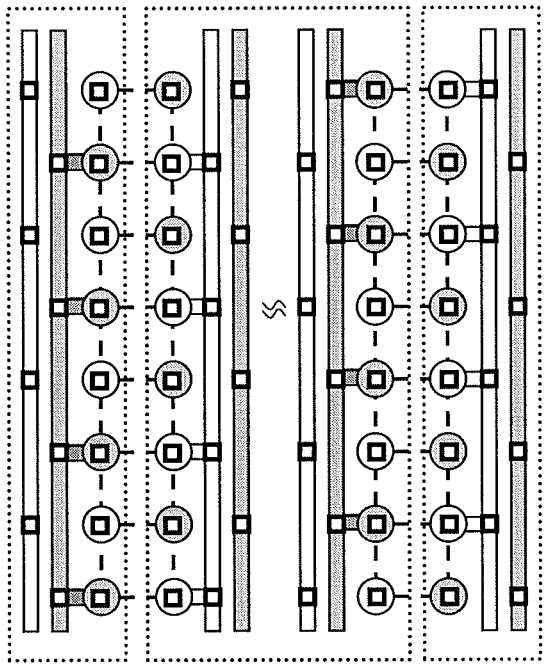
FIG. 20A and FIG. 20B are plan views showing a further example of power supply interconnects of a semiconductor chip.
Figure 20A:
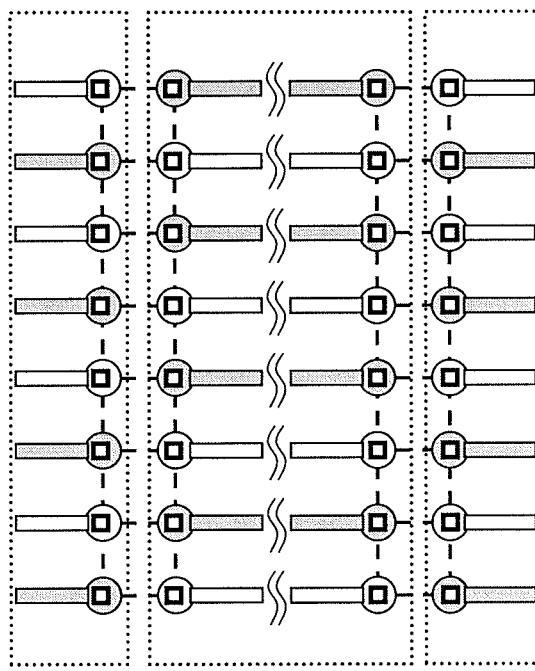

FIG. 16A and FIG. 16B show example interconnects in which, in the layout configuration of FIG. 2A, the count of rows of the TSVs is set at two. FIG. 17A and FIG. 17B show example interconnects in which, in the layout configuration of FIG. 2B, the count of rows of the TSVs is set at two. FIG. 18A and FIG. 18B show example interconnects in which, in the layout configuration of FIG. 2C, the count of rows of the TSVs is set at two. FIG. 19A and FIG. 19B show example interconnects in which, in the layout configuration of FIG. 3A, the count of rows of the TSVs is set at two. FIG. 20A and FIG. 20B show example interconnects in which, in the layout configuration of FIG. 3C, the count of rows of the TSVs is set at two. It is noted that FIG. 16A, FIG. 17A, FIG. 18A, FIG. 19A and FIG. 20A denote example interconnects of the interconnect layer M5, and that FIG. 16B, FIG. 17B, FIG. 18B, FIG. 19B and FIG. 20B denote example interconnects of the interconnect layer M4.

In FIG. 16A through to FIG. 20B, the TSVs of the regions surrounded by dotted lines are interconnected. However, the TSVs neighbored to each other cannot be interconnected, that is, the TSVs shown linked to one another by chain-dotted lines cannot be interconnected. Hence, the current cannot be equally distributed. That is, if simply the TSVs are arrayed in two rows, all of the TSVs cannot be interconnected, and hence the current values in the respective TSVs cannot be made equal. However, it should be noted that, if the TSVs are arrayed in one row and the interconnect layers M4, M5 form a power supply mesh, all of the TSVs can readily be interconnected, in which case it is possible to uniformly distribute the current.

The method for making interconnections to render the current values in the respective TSVs equal will now be explained. In making such interconnections, the TSVs used to supply power from a plurality of power supplies of the respective same sorts are electrically interconnected.

Figure 21B:
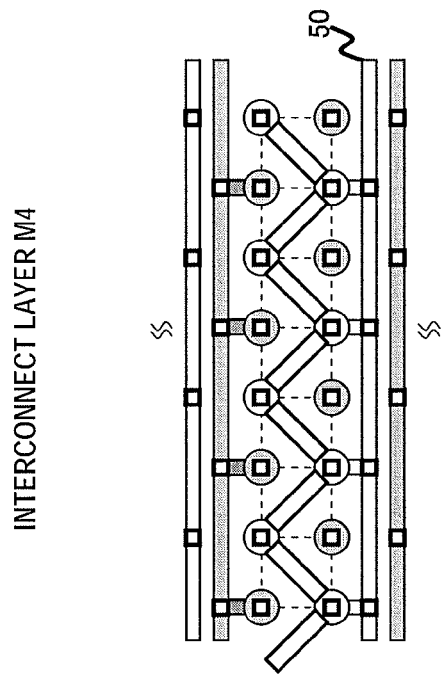
FIG. 21A and FIG. 21B are plan views showing a further example of power supply interconnects of a semiconductor chip.
Figure 21A:
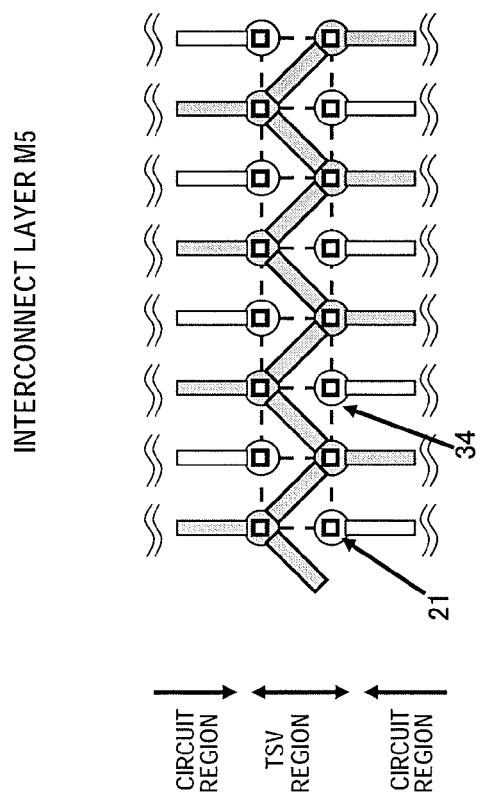
Figure 22B:
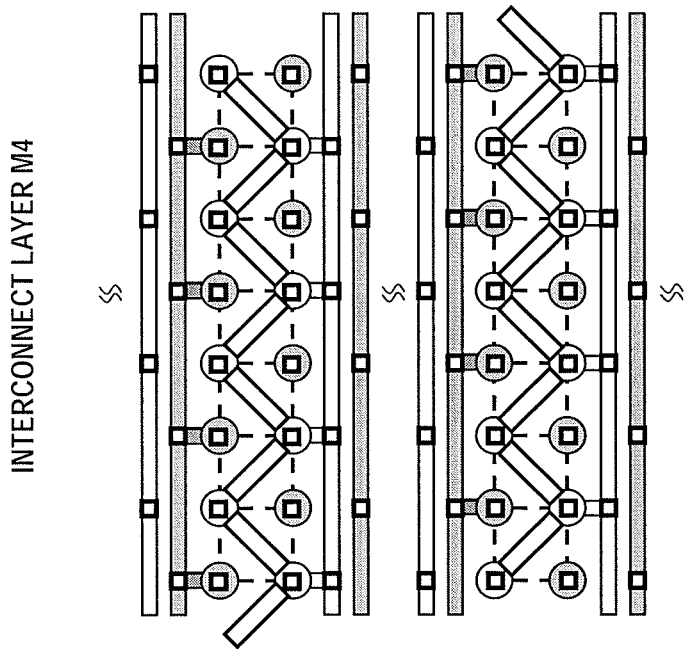
FIG. 22A and FIG. 22B are plan views showing a further example of power supply interconnects of a semiconductor chip.
Figure 22A:
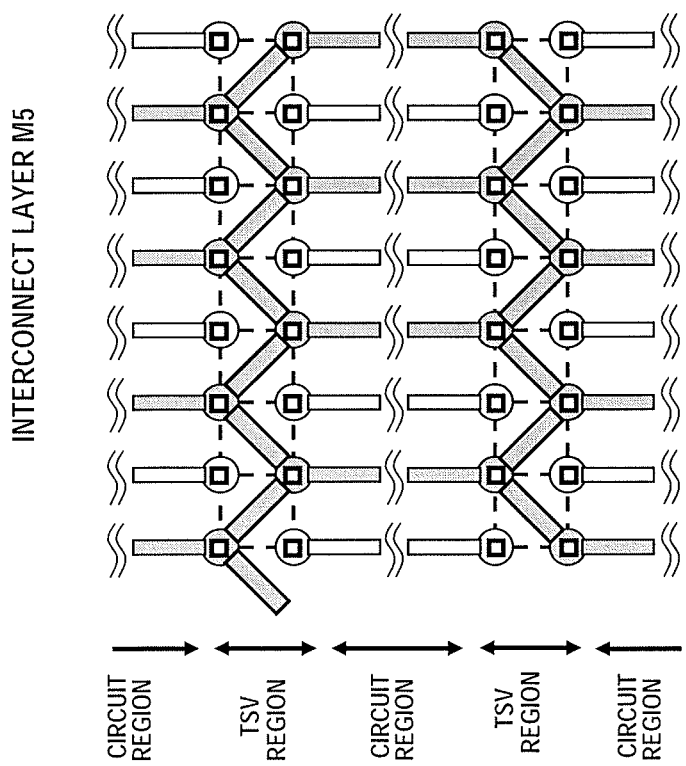

Note that, in such case, the TSVs are arrayed such as to reduce the inductors of respective TSVs, as already discussed. FIG. 21A and FIG. 21B show example interconnections in case in the layout configuration of FIG. 3A the TSVs are arrayed in accordance with the pattern 2. FIG. 22A and FIG. 22B show example interconnections in case in the layout configuration of FIG. 3C the TSVs are arrayed in accordance with the pattern 2. In the example interconnections of FIG. 21A, FIG. 21B, FIG. 22A and FIG. 22B, all of the TSVs destined for supplying the power of the power supplies of the respective same sorts are interconnected to provide for equalized values of the currents flowing through the respective TSVs. In the example interconnections of FIG. 21A, FIG. 21B, FIG. 22A and FIG. 22B, oblique extending interconnections are used in the interconnect layer M5 to interconnect all of the TSVs used to supply the power of the power supply VPERI.

On the other hand, the TSVs used to supply the power from the power supply VSS are interconnected in the interconnect layer M4, using oblique extending interconnects. Furthermore, TSV 33 and TSV 34 are connected together by an interconnect 50 of the interconnect layer M4 such that all TSVs used to supply the power of the power supply VSS are interconnected. This allows the impedance of the interconnects configured to supply the power of the power supply VPERI and that of the interconnects configured to supply the power of the power supply VSS to be lowered. Viz., in a semiconductor chip provided with a multi-layer interconnect structure, the TSVs used to supply the power of the power supply VPERI are connected together in the interconnect layer M5, whilst those used to supply the power of the power supply of the power supply VSS are connected together in the interconnect layer M4.

Figure 23:
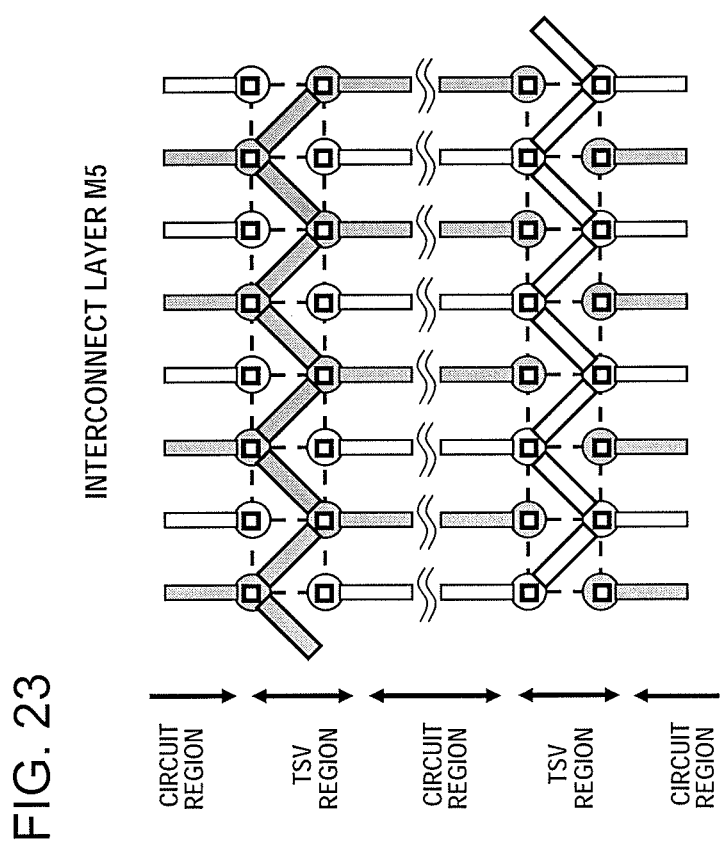
FIG. 23 is a plan view showing a further example of power supply interconnects of a semiconductor chip.

FIG. 23 shows another interconnect example in which, in the layout configuration of FIG. 3C, the TSVs are arrayed in accordance with the pattern 2. In FIG. 22A and FIG. 22B, the TSVs, used to supply the power from the power supply VPERI, and which are contained in two TSV regions 21, are connected together in the interconnect layer M5. In FIG. 23, on the other hand, TSVs of power supplies of respective different sorts are connected together in the TSV regions 21. More specifically, the TSVs used to supply the power of the power supply VPERI are connected together in the TSV region 21 shown on an upper side of FIG. 23 and, in the TSV region 21 on the lower side thereof, the TSVs used to supply the power of the power supply VSS are connected together. In such interconnections, it is still possible to equalize the values of the currents flowing through respective TSVs.

Figure 25B:
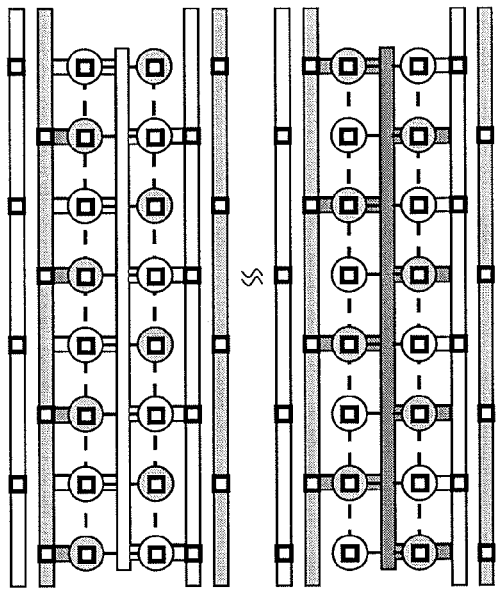
FIG. 25A and FIG. 25B are plan views showing a further example of power supply interconnects of a semiconductor chip.
Figure 25A:
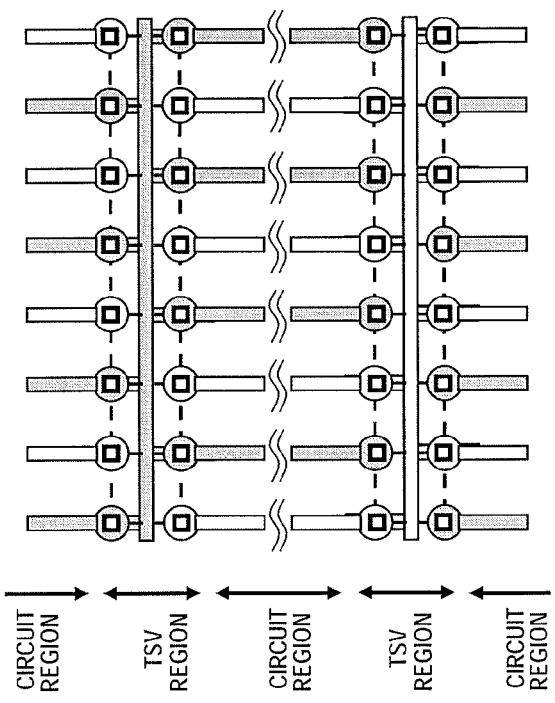

Even if oblique extending interconnects are not used, all of the TSVs can be connected together. FIG. 24A and FIG. 24B show example interconnections for a case in which, in the layout configuration of FIG. 3A, the TSVs are arrayed in accordance with the pattern 2. FIG. 25A and FIG. 25B show example interconnections for a case in which, in the layout configuration of FIG. 3C, the TSVs are arrayed in accordance with the pattern 2. As shown in FIG. 24A, FIG. 24B, FIG. 25A and FIG. 25B, key-shaped interconnects may be used to interconnect all of the TSVs of the power supplies of the respective same sorts to equalize the values of the currents flowing through the respective TSVs. For example, in FIG. 24A and in FIG. 24B, all of the TSVs, destined to supply the power of the power supply VPERI, are connected together in the interconnect layer M5, and the TSVs, destined to supply the power of the power supply VSS, are connected together in the interconnect layer M4.

Figure 26B:
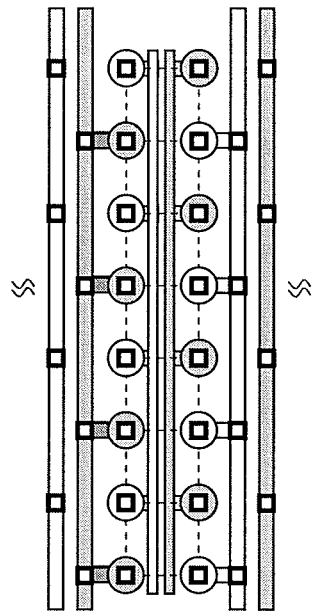
FIG. 26A and FIG. 26B are plan views showing a further example of power supply interconnects of a semiconductor chip.
Figure 26A:
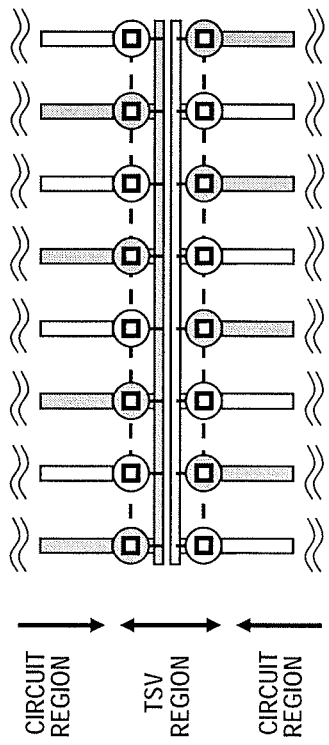

It is also possible to equalize the currents, flowing through the TSVs, by connecting many TSVs together, even if not all of the TSVs are connected together. FIG. 26A and FIG. 26B illustrate example interconnections for a case in which, in the layout configuration of FIG. 3A, the TSVs are arrayed in accordance with the pattern 2. As shown in FIG. 26A and FIG. 26B, the TSVs present in the TSV region 21 are separated into two stages, viz., into an upper stage and a lower stage, and the TSVs used to supply the power of the power supply VPERI present in the upper stage are connected together, whilst those used to supply the power of the power supply VSS present in the lower stage are connected together. More specifically, one half of the TSVs is interconnected in each TSV region in the interconnect layers M4 and M5.

Figure 28B:
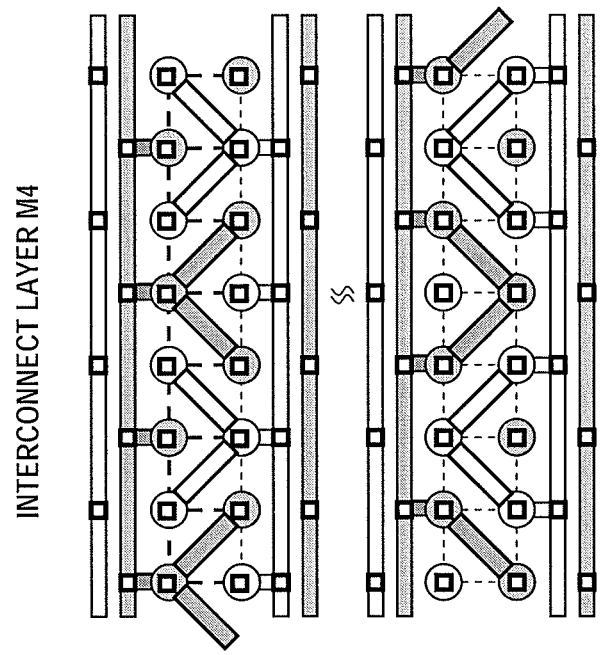
FIG. 28A and FIG. 28B are plan views showing a further example of power supply interconnects of a semiconductor chip.
Figure 28A:
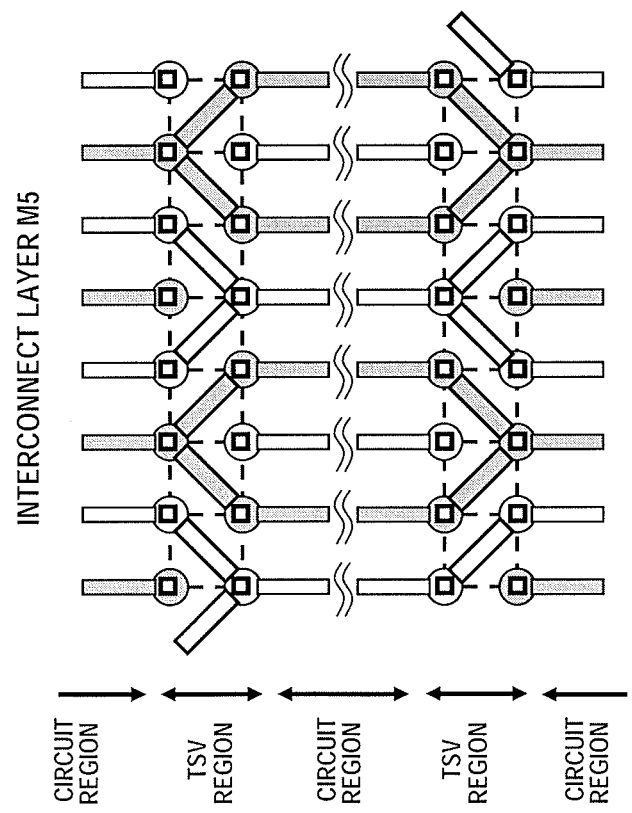
Figure 29B:
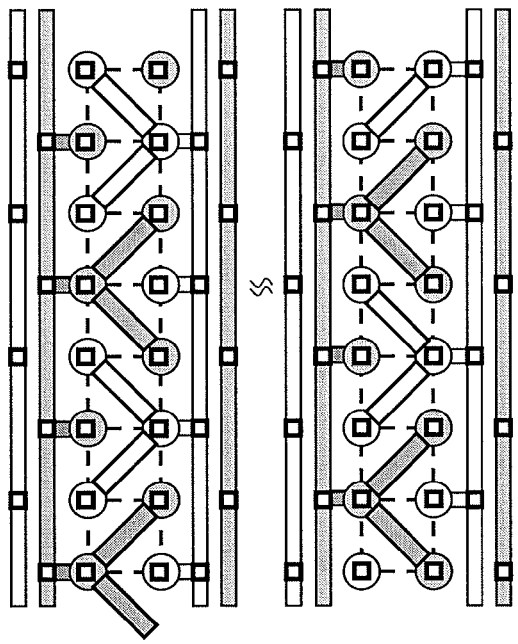
FIG. 29A and FIG. 29B are plan views showing a further example of power supply interconnects of a semiconductor chip.
Figure 29A:
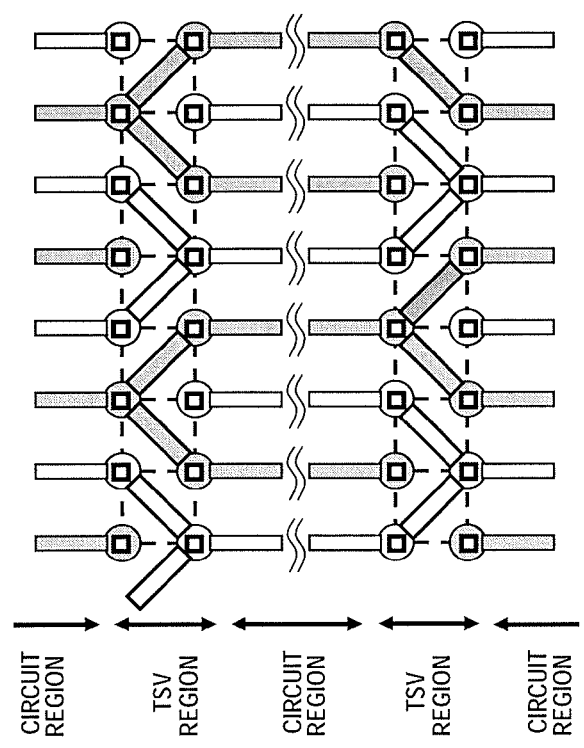

Additionally, the TSVs of the power supplies of the respective same sorts may be connected together in defined units to equalize the currents flowing through the TSVs. FIG. 27A and FIG. 27B illustrate example interconnections for a case in which, in the layout configuration of FIG. 3A, the TSVs are arrayed in accordance with the pattern 2. FIG. 28A and FIG. 28B illustrate example interconnection for a case in which, in the layout configuration of FIG. 3C, the TSVs are arrayed in accordance with the pattern 2. As shown for example in FIG. 27A and FIG. 27B, three TSVs, such as TSVs 35 to 37, are interconnected as one unit in the interconnect layer M5. The TSVs destined to supply the power of the power supply VPERI, and which are connected together in the defined unit in the interconnection layer M5, are connected together in the interconnect layer M4 by an interconnect 51. The same is true for the TSVs destined to supply the power of the power supply VSS. In case there are provided a plurality of TSV regions 21, TSVs of the power supplies of the respective different sorts may be connected together in the TSV regions 21 (see FIG. 29A and FIG. 29B).

Figure 30B:
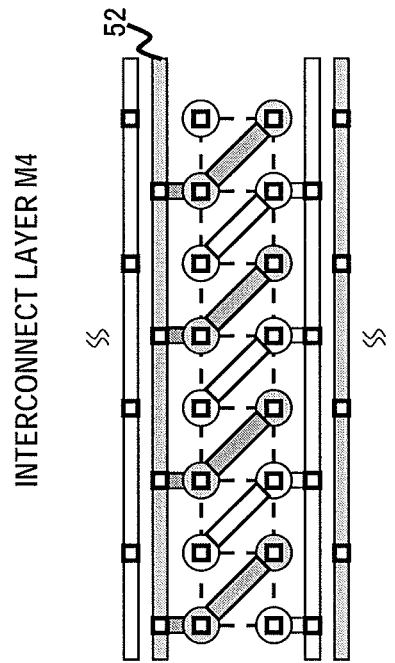
FIG. 30A and FIG. 30B are plan views showing a further example of power supply interconnects of a semiconductor chip.
Figure 30A:
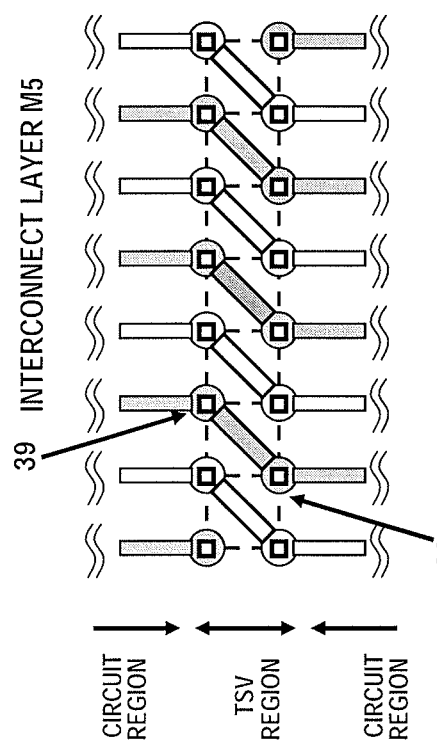
Figure 31B:
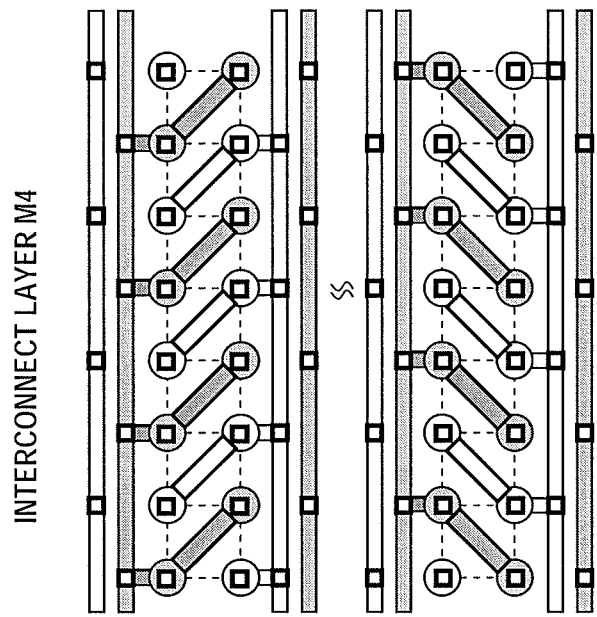
FIG. 31A and FIG. 31B are plan views showing a further example of power supply interconnects of a semiconductor chip.
Figure 31A:
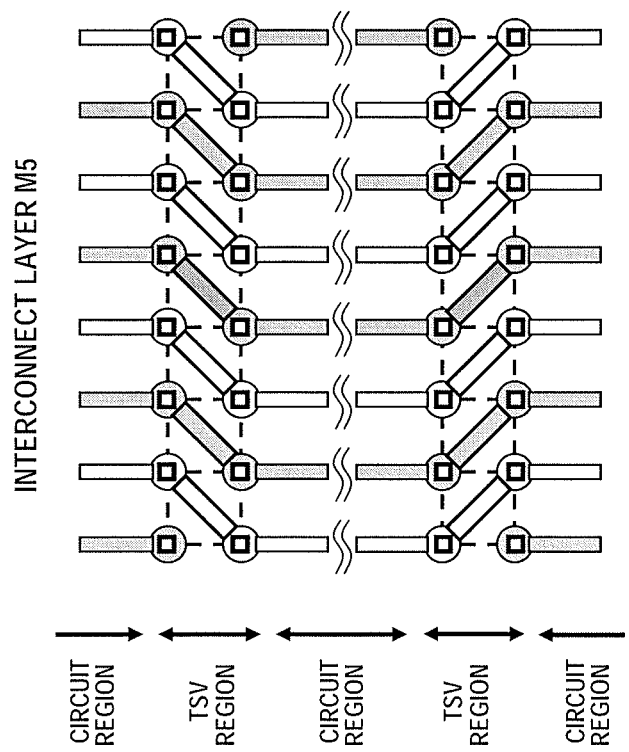

The number of the TSVs destined to supply the power of the power supplies of the respective same sorts, and which are connected together, need not necessarily be 3. FIG. 30A and FIG. 30B illustrate example interconnections for a case in which, in the layout configuration of FIG. 3A, the TSVs are arrayed in accordance with the pattern 2. FIG. 31A and FIG. 31B illustrate example interconnections for a case in which, in the layout configuration of FIG. 3C, the TSVs are arrayed in accordance with the pattern 2. For example, in FIGS. 30A and 30B, TSVs 38, 39, destined to supply the power from the power supply VPERI, are connected together in the interconnect layer M5. The TSVs, destined to supply the power from the power supply VPERI, and which are connected together in the interconnect layer M5, may be connected together via an interconnect 52 in the interconnect layer M4. The same is true for the TSVs destined to supply the power from the power supply VSS.

Figure 32:
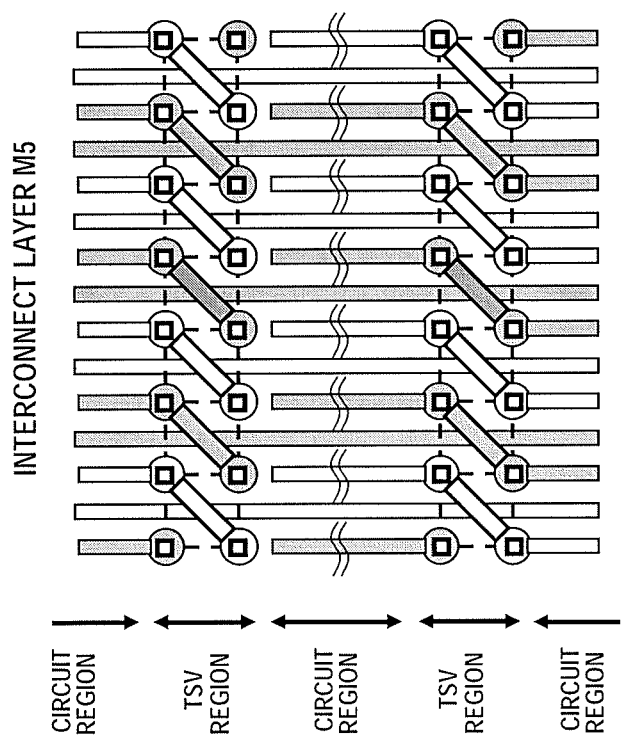
FIG. 32 is a plan view showing a further example of power supply interconnects of a semiconductor chip.

In making the interconnections, the phase of the string of TSVs, arrayed in two TSV regions, facing each other, also needs to be taken into consideration. In FIG. 22A and FIG. 22B, for example, the TSV strings, arrayed in the two oppositely disposed TSV regions 21, are not in phase with each other. It is however possible that the TSV strings, arrayed in the two oppositely disposed TSV regions, are in phase with each other. FIG. 32 shows example interconnections for a case in which, in the layout configuration of FIG. 3C, the TSVs are arrayed in accordance with the pattern 2. However, in such case, the interconnection is complicated, as may be seen from FIG. 32. It is thus desirable that the TSV strings, arrayed in the respective opposite TSV regions 21, are out of phase relative to each other.

Figure 33B:
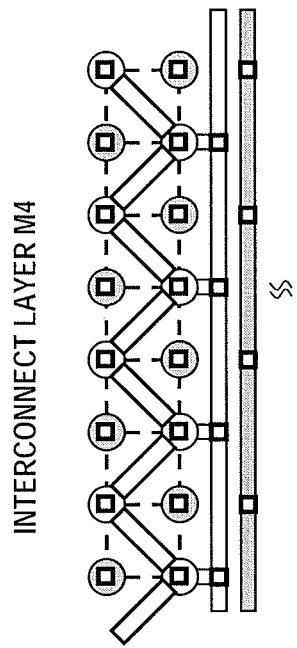
FIG. 33A and FIG. 33B are plan views showing a further example of power supply interconnects of a semiconductor chip.
Figure 33A:
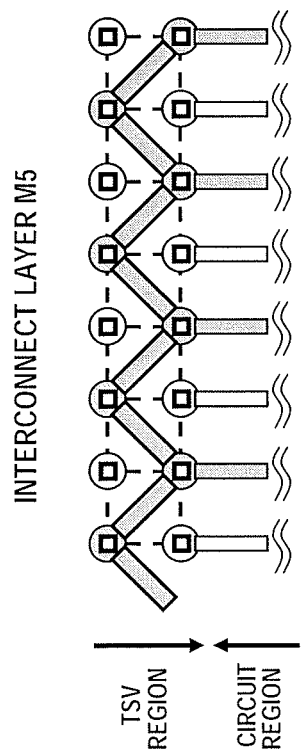
Figure 34B:
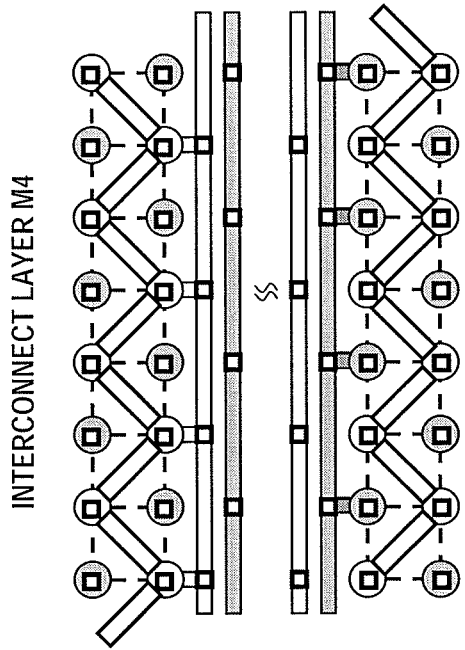
FIG. 34A and FIG. 34B are plan views showing a further example of power supply interconnects of a semiconductor chip.
Figure 34A:
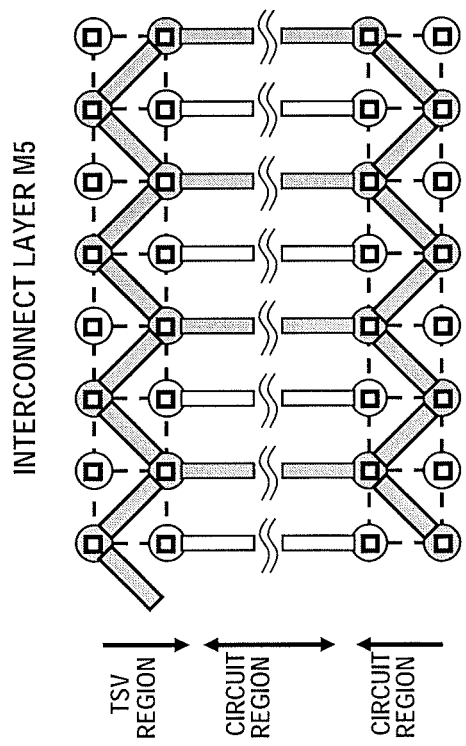

The power supply interconnections in the layouts shown in FIG. 2A and in FIG. 2B are now explained. FIGS. 33A and 33B illustrate example interconnections for a case in which, in the layout configuration of FIG. 2A, TSVs are arrayed in accordance with the pattern 2. FIGS. 34A and 34B illustrate an example interconnection for a case in which, in the layout configuration of FIG. 2B, TSVs are arrayed in accordance with the pattern 2. Even in these cases, the TSVs used to supply the power of the respective same sorts may be connected in common, using the oblique extending interconnects or key-shaped interconnects, already explained, such as to equalize the values of the currents flowing through the respective TSVs.

By interconnecting the TSVs of the power supplies of the respective same sorts, as described above, it is possible to equalize the values of the currents flowing through respective TSVs.

It is noted that, with reference to FIG. 21A, FIG. 21B et seq., the layouts interconnecting the TSVs of the power supplies of the respective same sorts make use of both the circuit regions 20 and the TSV regions 21 of both the interconnect layers M4 and M5. This results in significant constraints on signal interconnections other than the power supply interconnects in those interconnect layers. Hence, possible dispositions and interconnections of contacts interconnecting the TSVs of the power supplies of the respective same sorts within a limited region will now be scrutinized. More specifically, possible connections of TSVs of the power supplies of the respective same sorts within the TSV region 21 will be scrutinized.

Figure 35:
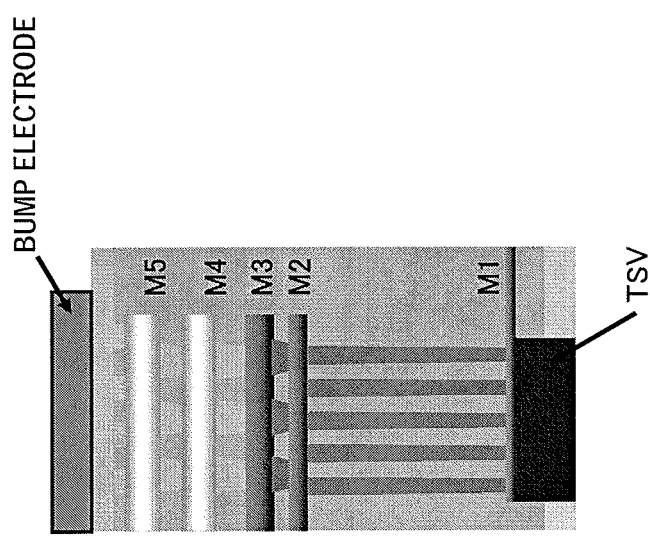
FIG. 35 is a schematic cross-sectional view showing a semiconductor chip having a multi-layer interconnect structure.

FIG. 35 depicts a cross-sectional view of a plurality of semiconductor chips having a multi-layer interconnect structure. The semiconductor chips shown in FIG. 35 are of a five-layer interconnect structure, and TSVs are connected to an interconnect layer M1. The plurality of the semiconductor chips are interconnected by a plurality of bump electrodes.

Figure 36A:
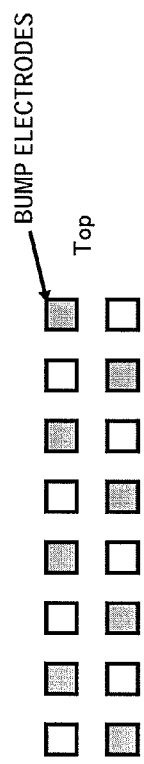
Figure 36B:
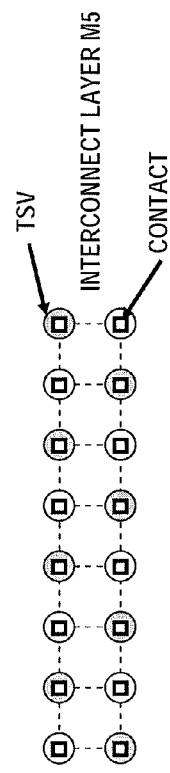
Figure 36C:
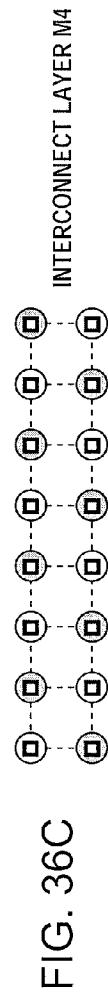
Figure 36D:
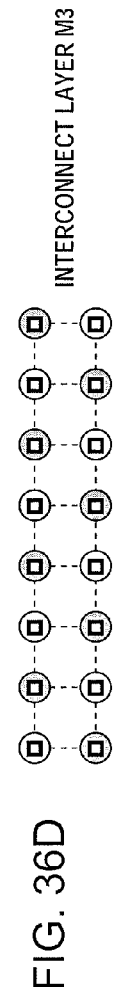
Figure 36E:
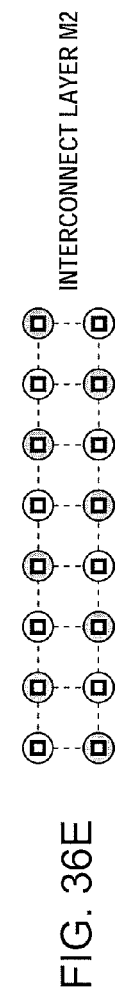

FIG. 36A through to FIG. 45F illustrate example dispositions of contacts from one interconnect layer of the semiconductor chip to another. In FIG. 36A through to FIG. 45F, non-shaded circles denote TSVs used to supply the power from the power supply VSS, and shaded circles those used to supply the power from the power supply VPERI. If, in each of the respective interconnect layers M1 to M5, square-shaped contacts are shown over the non-shaded circles or over the shaded circles, such indicates that contacts are arrayed for the interconnect layer of interest. If no square-shaped contacts are shown, such indicates that no contacts are arrayed for the interconnect layer of interest.

Figure 36F:
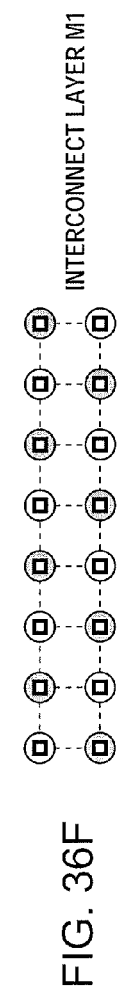
Figure 37A:
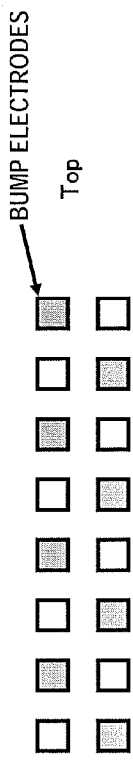
FIG. 37A, FIG. 37B, FIG. 37C, FIG. 37D, FIG. 37E and FIG. 37F are schematic plan views showing other example layouts of contacts from one interconnect layer of the semiconductor chip to another.
Figure 37B:
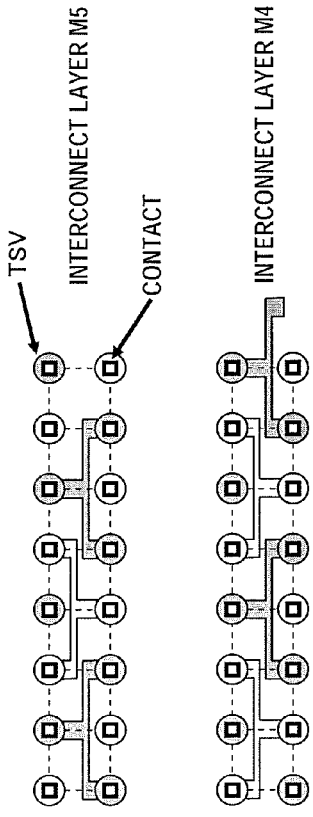
Figure 37C:
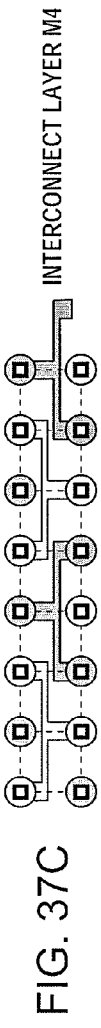
Figure 37D:
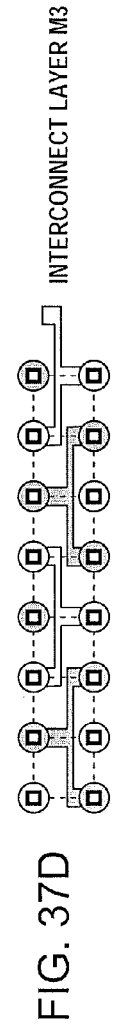
Figure 37E:
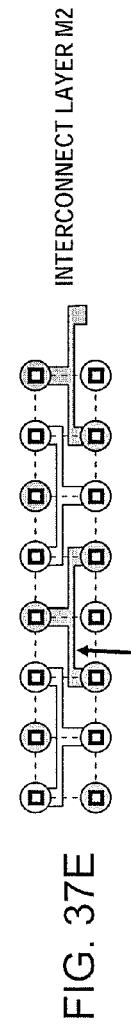
Figure 37F:
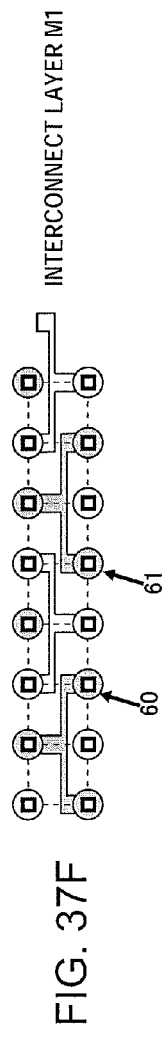
Figures 39A, 39B, 39C, 39D, 39E, 39F:
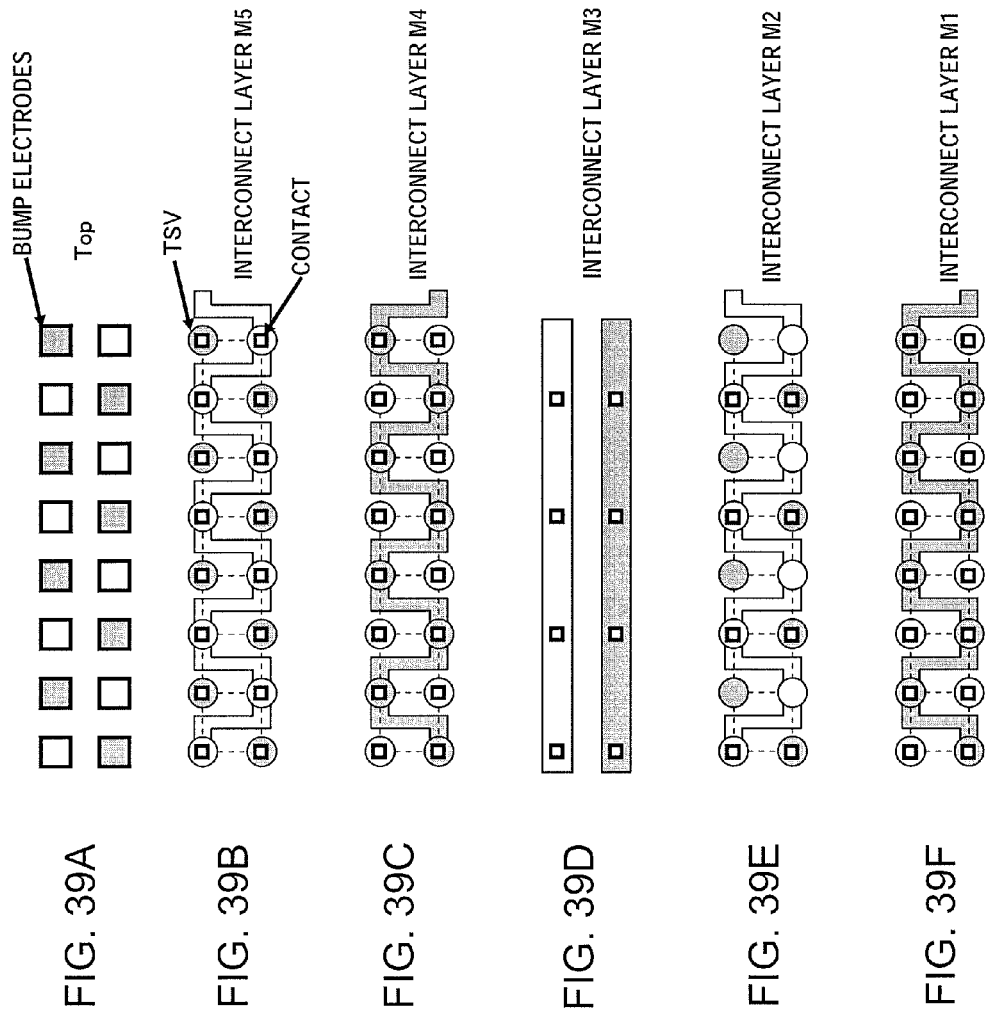
FIG. 39A, FIG. 39B, FIG. 39C, FIG. 39D, FIG. 39E and FIG. 39F are schematic plan views showing further example layouts of contacts from one interconnect layer of the semiconductor chip to another.
Figure 43A:
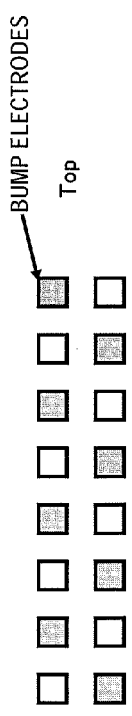
FIG. 43A, FIG. 43B, FIG. 43C, FIG. 43D, FIG. 44E and FIG. 44F are schematic plan views showing still other example layouts of contacts from one interconnect layer of the semiconductor chip to another.
Figure 43B:
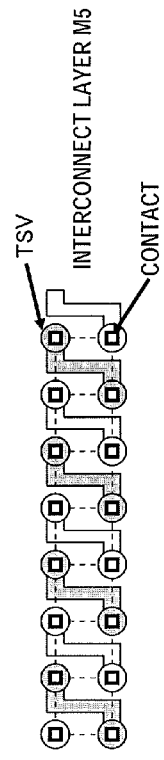
Figure 43C:
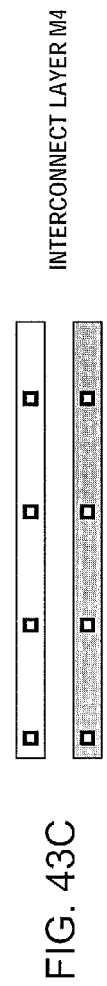
Figure 43D:
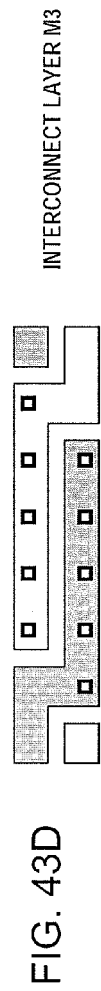
Figure 43E:
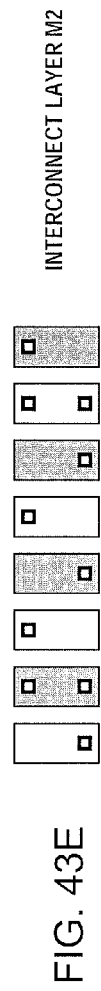
Figure 43F:
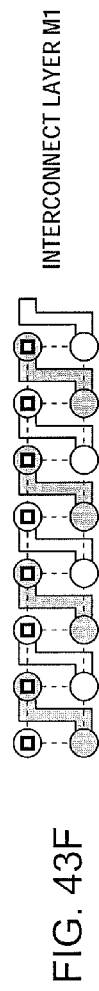

If, as shown in FIG. 36A, 36B, 36C, 36D, 36E and in FIG. 36F, all of the TSVs are connected just in the stack direction of the interconnect layers, it is not possible to equalize the currents flowing through all of the TSVs. In short, if the contacts are arrayed separately from one TSV to another, as shown in FIG. 36A, 36B, 36C, 36D, 36E and in FIG. 36F, it is not possible to equalize the currents flowing through the TSVs. Thus, contacts destined for the power supply VPERI and those destined for the power supply VSS are provided in the respective interconnect layers, and these contacts are connected together. By so doing, the TSVs of the power supplies of the respective same sorts may be connected together to equalize the currents flowing through the TSVs. Additionally, the dispositions and the interconnections of the contacts in the respective interconnect layers are optimized to ensure that interconnections of the TSVs are completed only within a region corresponding to the TSV region 21. That is, the interconnects of the respective interconnect layers extend within regions overlying the TSV regions of the respective interconnect layers, as a result of which the TSVs destined for supplying the power of the power supplies of the respective same sorts may be connected together to assure equalized currents flowing through the respective TSVs.

In FIG. 37A, FIG. 37B, FIG. 37C, FIG. 37D, FIG. 37E and FIG. 37F, the contacts are arranged on top of TSVs, in all of the interconnect layers, and are interconnected in defined units from one interconnect layer to the next. Thus, all of the TSVs of the power supplies of the respective same sorts are connected together. For example, the TSVs 60 and 61 in the interconnect layer M1, destined for supplying the power of the power supply VPERI, are connected together by an interconnect 53 of the interconnect layer M2. Or, in the case of interconnects shown in FIG. 38A, FIG. 38B, FIG. 38C, FIG. 38D, FIG. 38E and FIG. 38F, the TSVs of the power supplies of the respective same sorts may again be connected together in their entirety.

Referring to FIG. 39A, FIG. 39B, FIG. 39C, FIG. 39D, FIG. 39E and FIG. 39F, only contacts destined for the power supplies of the same sorts may be connected together in certain ones of the interconnect layers. In such case, contacts destined for all of the TSVs are required in the interconnect layer M5, because the TSVs and the bump electrodes are connected together by the contacts arranged in the interconnect layer M5. In FIG. 39A, FIG. 39B, FIG. 39C, FIG. 39D, FIG. 39E and FIG. 39F, the contacts destined for the power supply VPERI are connected together in the interconnect layers M1 and M4, and those destined for the power supply VSS are connected together in the interconnect layers M2 and M5.

Or, the layout shown in FIG. 40A, FIG. 40B, FIG. 40C, FIG. 40D, FIG. 40E and FIG. 40F may also be used. In FIG. 40A, FIG. 40B, FIG. 40C, FIG. 40D, FIG. 40E and FIG. 40F, only the contacts destined for the power supply VPERI are arrayed in a region 70 of the interconnect layer M2, whilst only the contacts destined for the power supply VSS are arrayed in a region 71 thereof as shown. By interconnecting the contacts destined for the power supplies of the respective same sorts in the specified interconnect layers, as shown in FIG. 39A, FIG. 39B, FIG. 39C, FIG. 39D, FIG. 39E, FIG. 39F, FIG. 40A, FIG. 40B, FIG. 40C, FIG. 40D, FIG. 40E and FIG. 40F, it is possible to increase the degree of freedom in making the interconnections in the interconnect layer M3.

On the other hand, the contacts destined for the power supplies of the respective same sorts are connected together in the interconnect layer M5, as shown in FIG. 41A, FIG. 41B, FIG. 41C, FIG. 41D, FIG. 41E, FIG. 41F, FIG. 42A, FIG. 42B, FIG. 42C, FIG. 42D, FIG. 42E and FIG. 42F. It is thus possible to increase the degree of freedom in making interconnections in the intermediate interconnect layers M2 to M4. In this case, the shape of interconnects in the interconnect layer M1 connecting to the TSVs is the same as that of interconnects in the interconnect layer M5 connecting to the bump electrodes. It is because the interconnect layer connecting to the TSVs is the interconnect layer M1 and the interconnect layer connecting to the bump electrodes is the interconnect layer M5. On the other hand, interconnect layout may freely be selected in keeping with the location of the TSV region 21 within the semiconductor chip. Furthermore it is possible to use such interconnect whose thickness is thicker than the pitch between the neighbored TSVs.

Figure 44A:
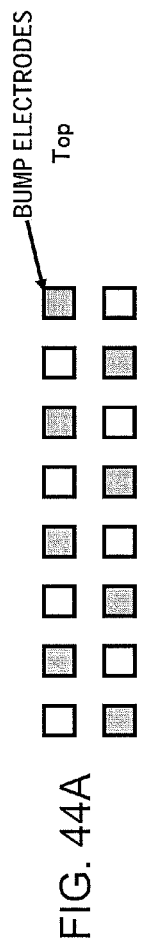
Figure 44B:
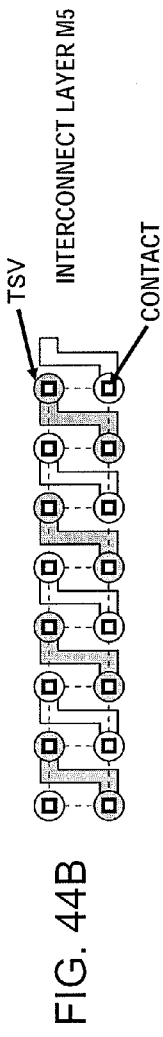
Figure 44C:
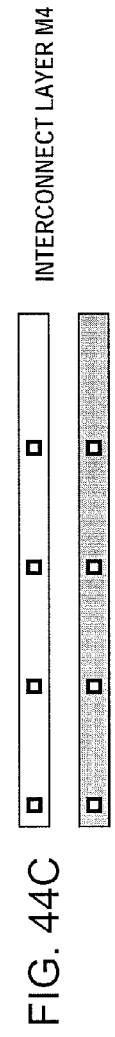
Figure 44D:
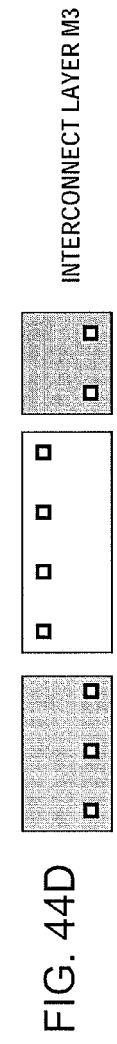
Figure 44E:
Figure 44F:
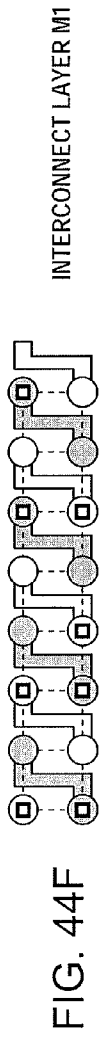
Figure 46:
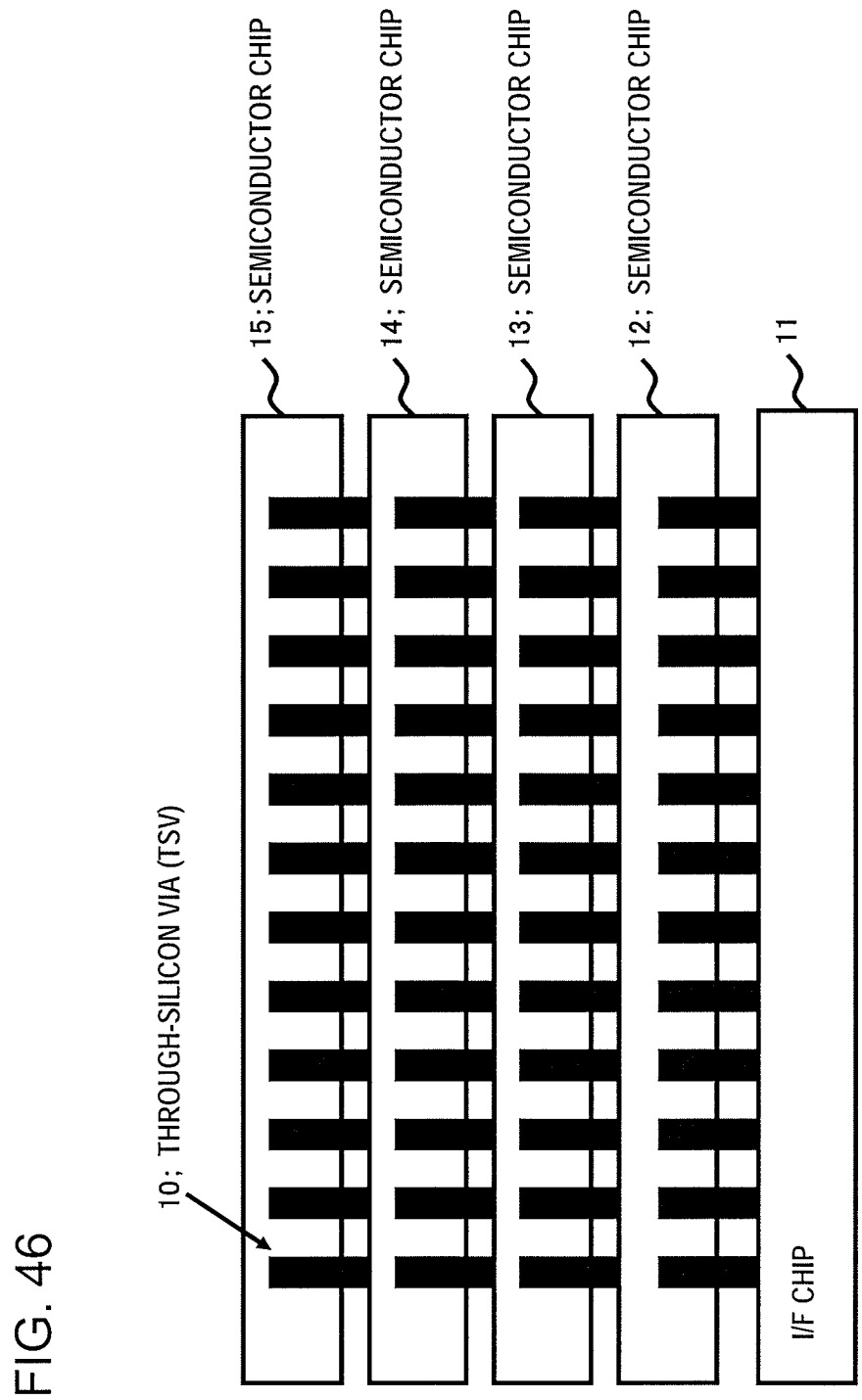
FIG. 46 is a schematic cross-sectional view of a semiconductor device having a plurality of semiconductor chips stacked together.

Even with contact dispositions shown in FIG. 43A, FIG. 43B, FIG. 43C, FIG. 43D, FIG. 43E, FIG. 43F, FIG. 44A, FIG. 44B, FIG. 44C, FIG. 44D, FIG. 44E and FIG. 44F, it is again possible to increase the degree of freedom in making the interconnections of the interconnect layers M2 to M4. For example, in the interconnect layer M2, shown in FIG. 43A, FIG. 43B, FIG. 43C, FIG. 43D, FIG. 43E and FIG. 43F, the interconnect used in the interconnect layer M3 may be of a thickness five times as large as the TSV pitch as the interconnect thickness is kept equal to the TSV pitch. Or, as shown in FIG. 44A, FIG. 44B, FIG. 44C, FIG. 44D, FIG. 44E and FIG. 44F, the interconnect whose thickness is four times the TSV pitch may be used in the interconnect layers M2 and M3. That is, the interconnect thicker in thickness than the TSV layout pitch may be used in the intermediate interconnect layers. In particular, the layout of the interconnect layer M3 shown in FIG. 44D is suited for a case in which the TSV region 21 is disposed around the rim of the semiconductor chip. Or, the layout of the interconnect layer M2 shown in FIG. 44E is suited for a case in which the TSV region 21 is arrayed in the inner side of the semiconductor chip. It is because the power of the power source may be supplied with ease to the circuit region 20 neighbored to the TSV region 21.

Figure 47B:
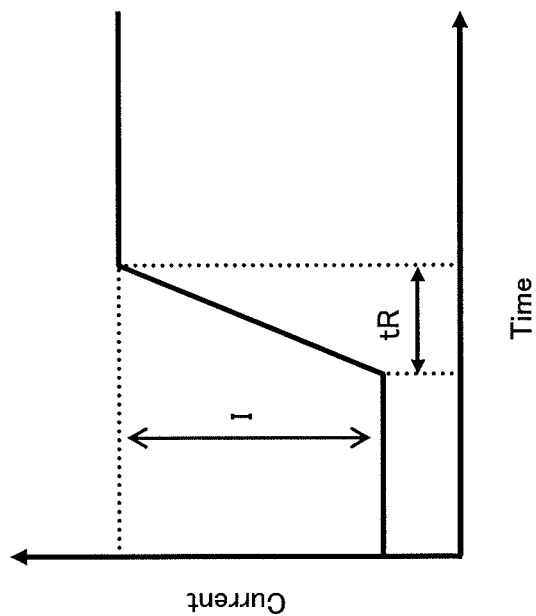
FIG. 47A and FIG. 47B are graphs showing example supply voltages and example input currents in case of variations in semiconductor chip loads.
Figure 47A:
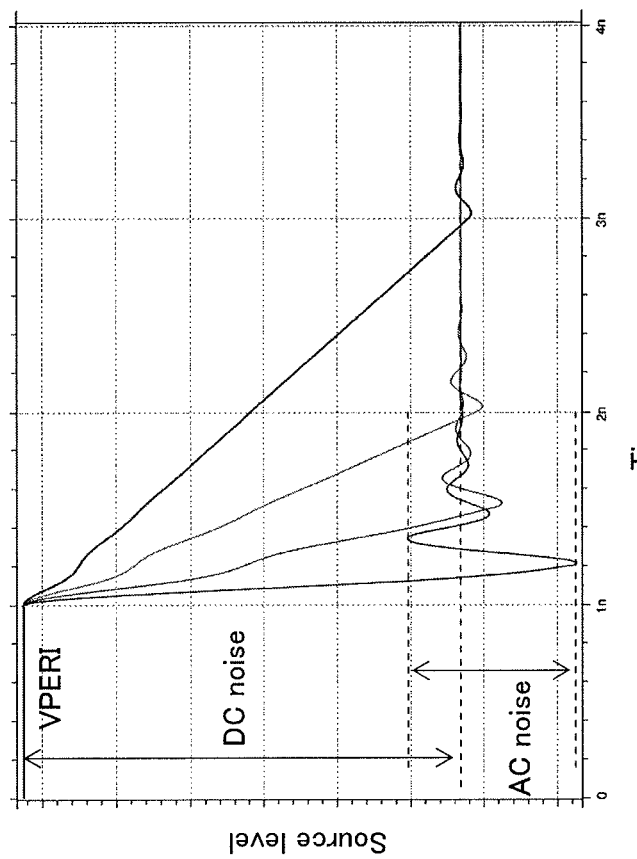

FIG. 45A, FIG. 45B, FIG. 45C, FIG. 45D, FIG. 45E and FIG. 45F indicate that contacts of the interconnect layer M1 need not necessarily be arrayed on top of the TSV. By the way, it is necessary for the count of the contacts of the interconnect layer M5 connected to the bump electrodes to be equal to the count of the TSVs contained in the semiconductor chip. However, the count of the contacts necessary for the interconnect layer M1 may be smaller than that of the TSVs contained in the semiconductor chip, because it is only necessary that, in the interconnect layers higher in level than the layer M1, the TSVs of the respective same sorts are arrayed and connected together. In addition, the power supply interconnect impedance may be matched by arraying contacts on top of power supply interconnects as shown in FIG. 47A and FIG. 47B.

As described above, TSVs of the respective same sorts may be connected together with the use of a plurality of the interconnect layers to equalize the values of the currents flowing through the TSVs. At such time, interconnects in the respective interconnect layers and in the TSV regions 21 may be suitably selected to improve the degree of freedom in making the interconnections.

As described above in connection with the exemplary embodiments, it is possible to reduce the effect of inductance components of the TSVs. Utmost beneficent results may be obtained in the sites of the circuitry subject to severe changes in the current values, that is, in those circuitry sites where higher values of di/dt of the power supply current are met. An example of such site of the circuitry is a logic LSI (Large Scale Integration) with a power switch that is changed over between active and sleep periods in a short time. Other examples include a logic LSI with clocked gating and a power supply used to supply the power to a sense amplifier in a DRAM.

Moreover, the following modes are possible:

[Mode 1]
A semiconductor device according to the above mentioned first aspect. Such a semiconductor device may be provided in which it is possible to reduce the noise ascribable to the inductor of the through-substrate via.

[Mode 2]
Preferably, the semiconductor device includes a plurality of through-substrate via strings, preferably the first through-substrate vias and the second through-substrate vias contained in the through-substrate via strings are arrayed staggered relative to each other.

[Mode 3]
In the semiconductor device, preferably the plurality of the first through-substrate vias are electrically connected to one another and the plurality of the second through-substrate vias are electrically connected to one another.

[Mode 4]
Preferably, the semiconductor device includes a multi-layer interconnect structure, and preferably the first through-substrate vias contained in the first and second through-substrate via strings are connected together in a first interconnect layer.

[Mode 5]
In the semiconductor device, preferably the second through-substrate vias contained in the first and second through-substrate via strings are connected together in a second interconnect layer different from the first interconnect layer.

[Mode 6]
To connect the first through-substrate vias together or to connect the second through-substrate vias together, preferably an oblique extending interconnect or a key-shaped interconnect is used.

[Mode 7]
In the semiconductor device, preferably the first through-substrate vias contained in the first and second through-substrate via strings are connected together using an interconnect extending within a region corresponding to defined regions of the plurality of interconnect layers containing the first and second through-substrate via strings.

[Mode 8]
In the semiconductor device, preferably an interconnect connecting together the plurality of the first through-substrate vias in a lowermost interconnect layer when seen in a second direction corresponding to an interconnect layer stack direction, with the substrate structure as reference, has a same shape as an interconnect connecting together the plurality of the first through-substrate vias in an uppermost interconnect layer in the second direction.

[Mode 9]
The semiconductor device preferably uses an interconnect thicker in thickness than an arraying pitch of the first and second through-substrate vias in an intermediate interconnect layer between the lowermost and uppermost interconnect layers.

[Mode 10]
In the semiconductor device, preferably a plurality of first contacts connecting to a plurality of bump electrodes corresponding to the plurality of the first through-substrate vias and to the plurality of the second through-substrate vias are provided in the uppermost interconnect layer. Preferably, a total number of the first contacts is equal to a total number of the plurality of the first through-substrate vias and the plurality of the second through-substrate vias. Also preferably, there are provided a plurality of second contacts for the lowermost interconnect layer, connecting together the first and second through-substrate vias with the interconnect layers provided along the second direction, with a total number of the second contacts being lesser than a total number of the first and second through-substrate vias.

[Mode 11]

A semiconductor device, preferably, comprises: a first through via that penetrates a substrate to supply a first power supply voltage; a second through via that penetrates the substrates to supply the second power supply voltage different from the first power supply voltage; a third through via that penetrates the substrate and is formed between the first and second through vias to supply the second power supply voltage; and a fourth through via that penetrates the substrate and is formed between the second and third through vias to supply the first power supply voltage.

[Mode 12]

In the semiconductor device, preferably, the first to fourth vias are aligned in a straight line.

[Mode 13]

In the semiconductor device, preferably, each closest two through substrate vias includes a specific distance.

[Mode 14]

In the semiconductor device, preferably, a space between each closest two through substrate vias is free from another through substrate via.

The disclosure of the above stated patent Publications is incorporated by reference herein. The particular exemplary embodiments or examples may be modified or adjusted within the gamut of the entire disclosure, inclusive of claims, based on the fundamental technical concept of the disclosure. Moreover, a variety of combinations or selections of elements disclosed herein, inclusive of elements of the claims, exemplary embodiment or Examples as well as elements of the drawings may be made within the concept of the claims. Viz., the present disclosure may encompass a wide variety of modifications or corrections that may occur to those skilled in the art in accordance with the entire disclosure, inclusive of claim and the technical concept of the present disclosure. In particular, as regards the ranges of numerical values, set out above, optional numerical values or optional sub-ranges, contained in such ranges, should be interpreted as if they are explicitly stated, even though such optional numerical values or optional sub-ranges are not so stated.

What is claimed is:

1. A semiconductor device, comprising:
a plurality of first through-substrate vias that are electrically connected to one another in a first interconnect layer in the semiconductor device and penetrate through a substrate structure of the semiconductor device, the semiconductor device configured so that the plurality of first through-substrate vias supply power of a first power supply; and
a plurality of second through-substrate vias that are electrically connected to one another in a second interconnect layer in the semiconductor device and penetrate through the substrate structure, the semiconductor device configured so that the plurality second through-substrate vias supply power of a second power supply different from the first power supply; wherein
the first and second through-substrate vias are arrayed adjacent to one another extending in a first direction to form at least one through-substrate via string.

2. The semiconductor device according to claim 1, wherein
the at least one through-substrate via string is comprised of a plurality of through-substrate via strings including a first through-substrate via string and a second through-substrate via string;
the first through-substrate vias and the second through-substrate vias contained in the plurality of through-substrate via strings being arrayed staggered relative to each other.

3. The semiconductor device according to claim 2, wherein
the first through-substrate vias contained in the first and second through-substrate via strings are connected together in the first interconnect layer.

4. The semiconductor device according to claim 3, wherein
the second through-substrate vias contained in the first and second through-substrate via strings are connected together in the second interconnect layer different from the first interconnect layer.

5. The semiconductor device according to claim 3, wherein,
to connect the first through-substrate vias together or to connect the second through-substrate vias together, an interconnect that extends obliquely relative to the first direction or a key-shaped interconnect is used.

6. The semiconductor device according to claim 3, wherein,
the first through-substrate vias contained in the first and second through-substrate via strings are connected together using an interconnect extending within a region corresponding to defined regions of the plurality of interconnect layers containing the first and second through-substrate via strings.

7. The semiconductor device according to claim 6, wherein,
a shape of a first interconnect connecting together the plurality of the first through-substrate vias in a lowermost interconnect layer when seen in a second direction corresponding to an interconnect layer stack direction, with the substrate structure as a reference, is the same as that of a second interconnect connecting together the plurality of the first through-substrate vias in an uppermost interconnect layer in the second direction.

8. The semiconductor device according to claim 7, wherein,
an interconnect thicker in thickness than an arraying pitch of the first and second through-substrate vias is used in each intermediate interconnect layer between the lowermost and uppermost interconnect layers.

9. The semiconductor device according to claim 7, wherein,
a plurality of first contacts connecting to a plurality of bump electrodes corresponding to the plurality of the first through-substrate vias and to the plurality of the second through-substrate vias are provided in the uppermost interconnect layer;
a total number of the first contacts being equal to a total number of the plurality of the first through-substrate vias and the plurality of the second through-substrate vias;
a total number of second contacts in the lowermost interconnect layer, connecting together the first and second through-substrate vias with the interconnect layers in the second direction, is lesser than a total number of the first and second through-substrate vias.

10. A semiconductor device, comprising:
a first through via that penetrates a semiconductor substrate to supply a first power supply voltage;

a second through via that penetrates the semiconductor substrate to supply the second power supply voltage different from the first power supply voltage;

a third through via that penetrates the semiconductor substrate and is formed between the first and second through vias to supply the second power supply voltage; and a fourth through via that penetrates the semiconductor substrate and is formed between the second and third through vias to supply the first power supply voltage, and wherein the first and fourth vias are electrically connected to one another in a first interconnect layer in the semiconductor device, and the second and third vias are electrically connected to one another in a second interconnect layer in the semiconductor device.

11. The semiconductor device according to claim 10, wherein the first to fourth vias are aligned in a straight line.

12. The semiconductor device according to claim 11, wherein each closest two through substrate vias includes a specific distance.

13. The semiconductor device according to claim 10, wherein a space between each closest two through substrate vias is free from another through substrate via.

14. A semiconductor device, comprising semiconductor substrate including a first interconnect layer and a second interconnect layer:

a plurality of first through-substrate vias that are electrically connected to one another in the first interconnect layer; and a plurality of second through-substrate vias that are electrically connected to one another in the second interconnect layer, and the first through-substrate vias being provided adjacently to the second through-substrate vias, on a line extending in a first direction.

\* \* \* \* \*